United States Patent
Oishi et al.

(10) Patent No.: US 6,344,388 B1
(45) Date of Patent: *Feb. 5, 2002

(54) METHOD OF MANUFACTURING SEMICONDUCTOR DEVICE

(75) Inventors: Toshiyuki Oishi; Yukio Nishida; Hirokazu Sayama, all of Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/325,803

(22) Filed: Jun. 4, 1999

(30) Foreign Application Priority Data

Dec. 25, 1998 (JP) .......................................... 10-369091

(51) Int. Cl.[7] .......................................... H01L 21/8236
(52) U.S. Cl. ..................... 438/241; 438/481; 438/595
(58) Field of Search ................................ 438/481, 595, 438/FOR 193, 241, 275

(56) References Cited

U.S. PATENT DOCUMENTS

| | | | |
|---|---|---|---|
| 5,291,052 A | * | 3/1994 | Kim et al. |
| 5,573,965 A | * | 11/1996 | Chen et al. |
| 5,783,479 A | * | 7/1998 | Lin et al. |
| 5,814,537 A | * | 9/1998 | Maa et al. |
| 5,851,890 A | * | 12/1998 | Tsai et al. |
| 5,915,182 A | * | 6/1999 | Wu |
| 5,976,938 A | * | 11/1999 | Gardner et al. |

FOREIGN PATENT DOCUMENTS

JP 3-24733 2/1991

* cited by examiner

Primary Examiner—George Fourson
Assistant Examiner—Joannie Adelle Garcia
(74) Attorney, Agent, or Firm—Oblon, Spivak, McClelland, Maier & Neustadt, P.C.

(57) ABSTRACT

In a method of manufacturing a semiconductor device capable of reducing gate resistance by increasing the width of a conductive layer formed on a gate electrode without increasing the gate length, an extension is formed in an upper surface of a silicon substrate, and thereafter a silicon oxide film and a silicon nitride film are deposited on the overall surface. Then, the silicon nitride film and the silicon oxide film are anisotropically etched in this order. Then, another silicon oxide film is deposited on the overall surface and thereafter anisotropically etched. Then, ion implantation is performed through a gate electrode and a side wall serving as masks, to form an impurity region. Silicon is grown under conditions having selectivity for a silicon oxide film, to form a silicon growth layer. Then, cobalt is deposited on the overall surface and thereafter heat treatment is performed to form a cobalt silicide layer. Thereafter unreacted cobalt is removed.

16 Claims, 30 Drawing Sheets

PRIOR ART  FIG. 46
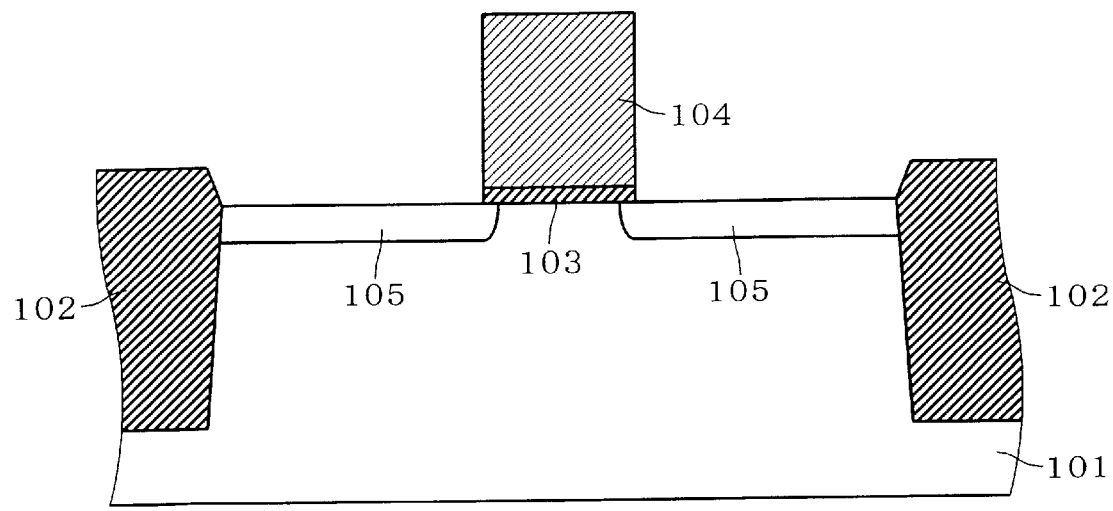
PRIOR ART  FIG. 47
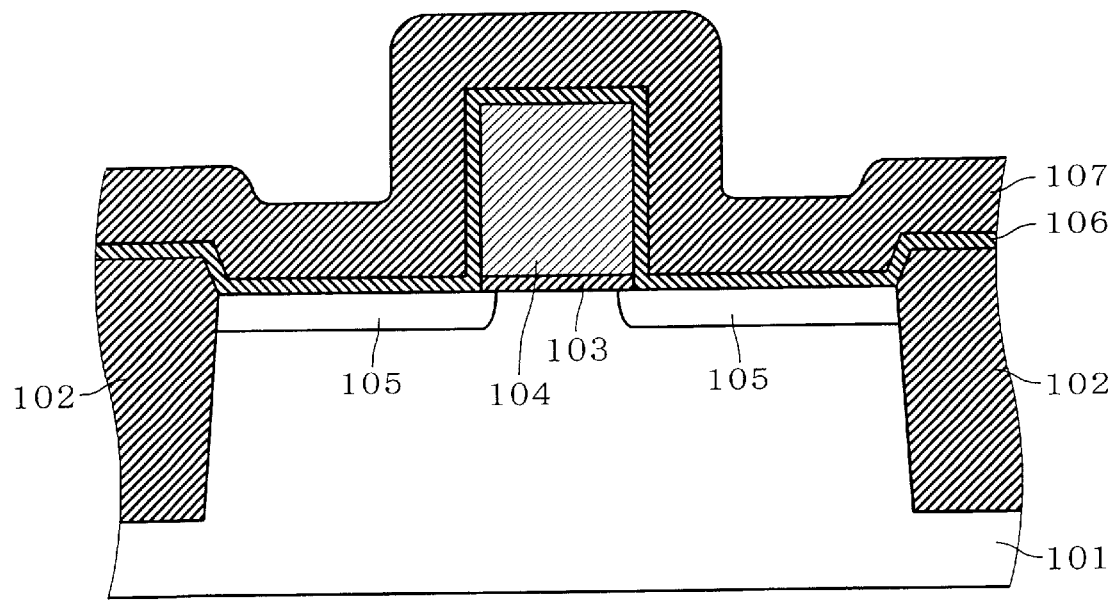

PRIOR ART FIG. 48
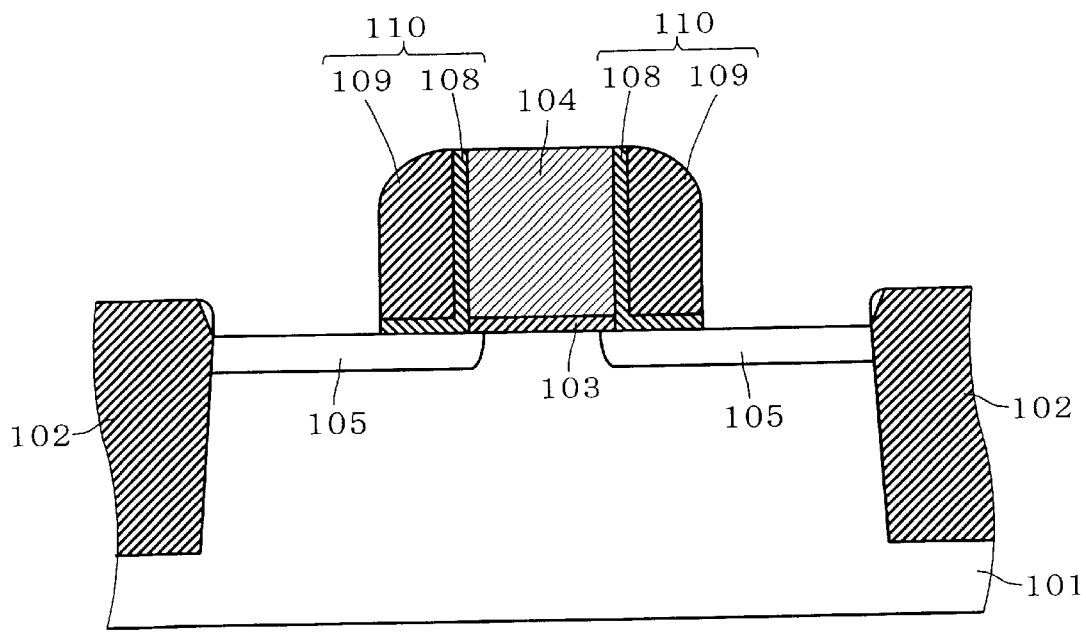
PRIOR ART FIG. 49
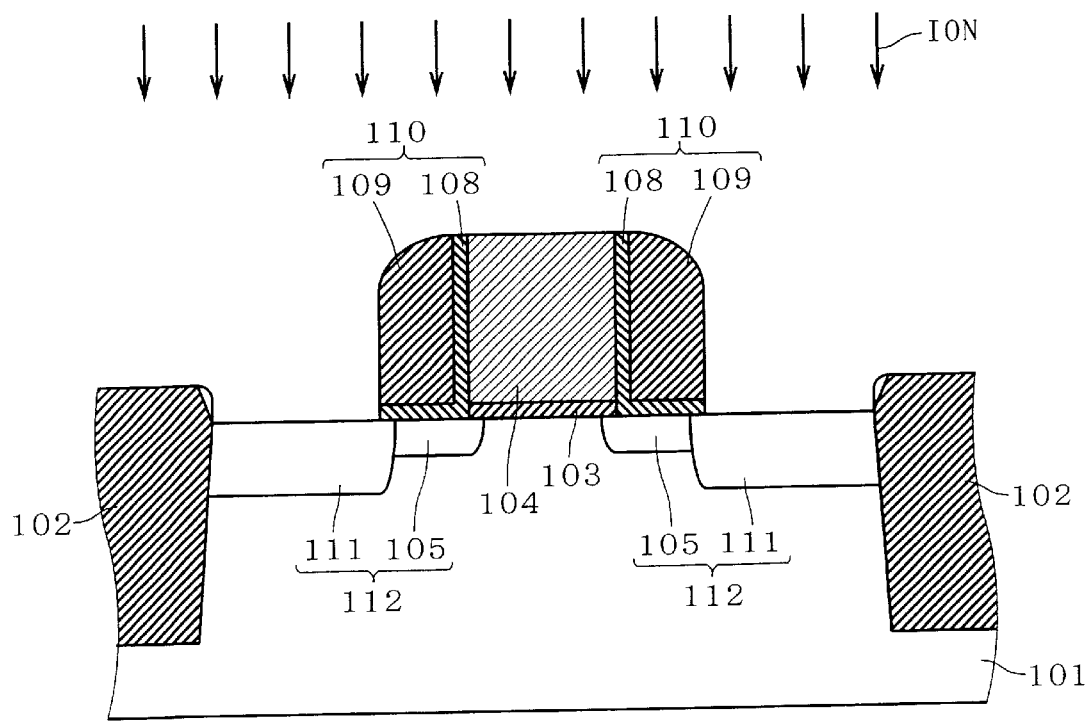

PRIOR ART FIG. 50
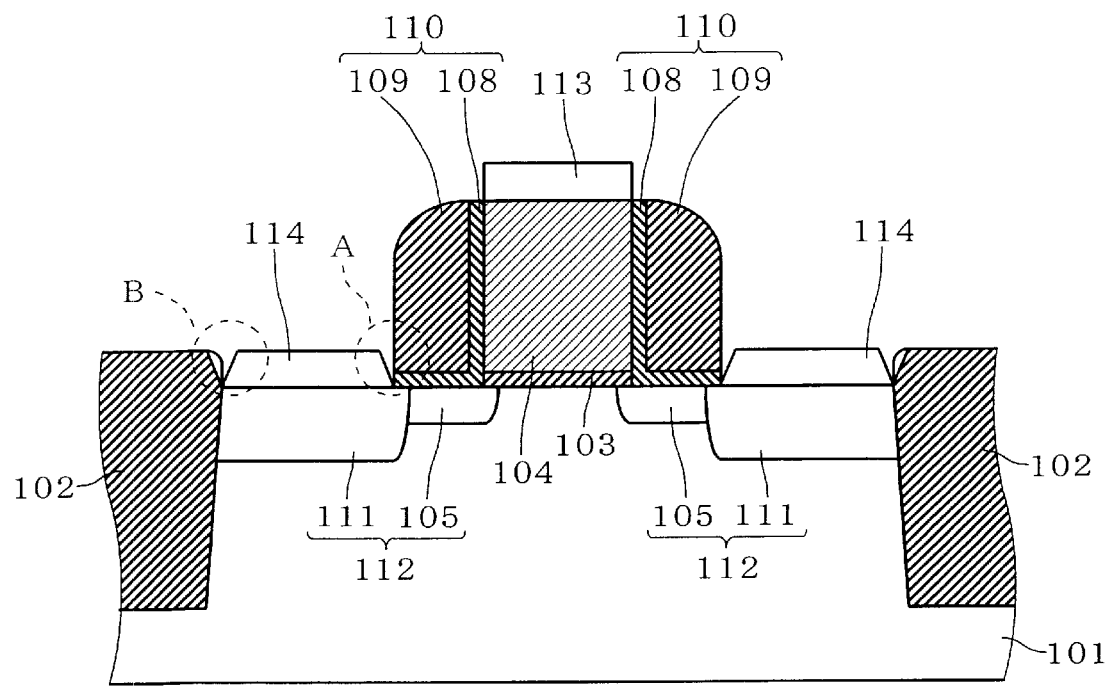
PRIOR ART FIG. 51
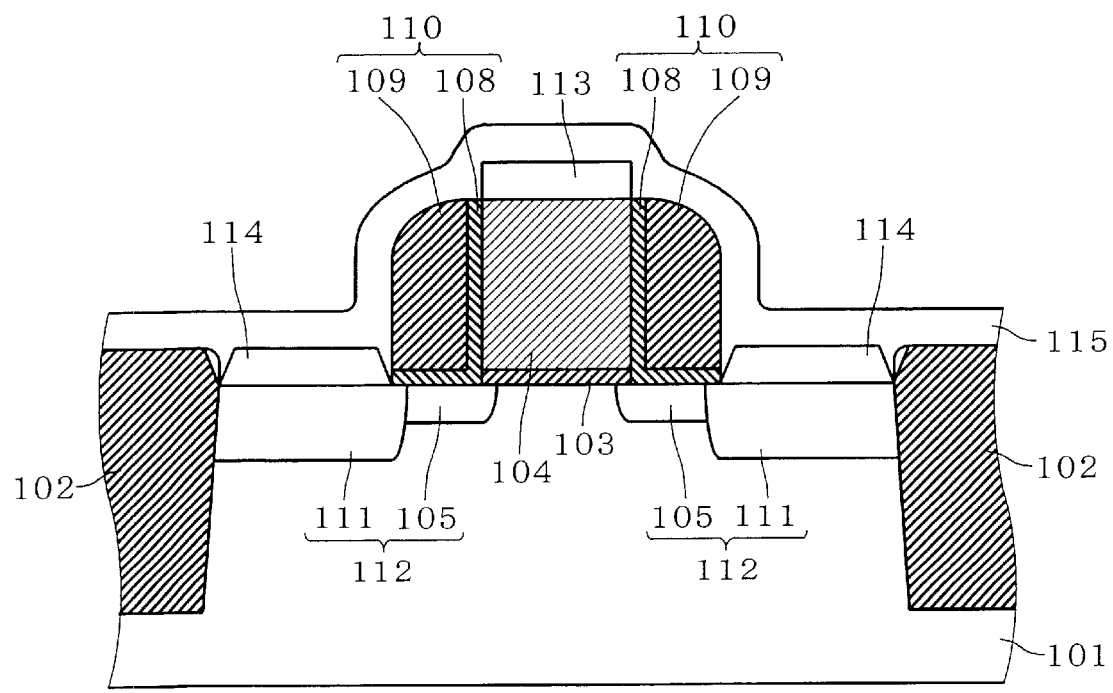

PRIOR ART FIG. 52
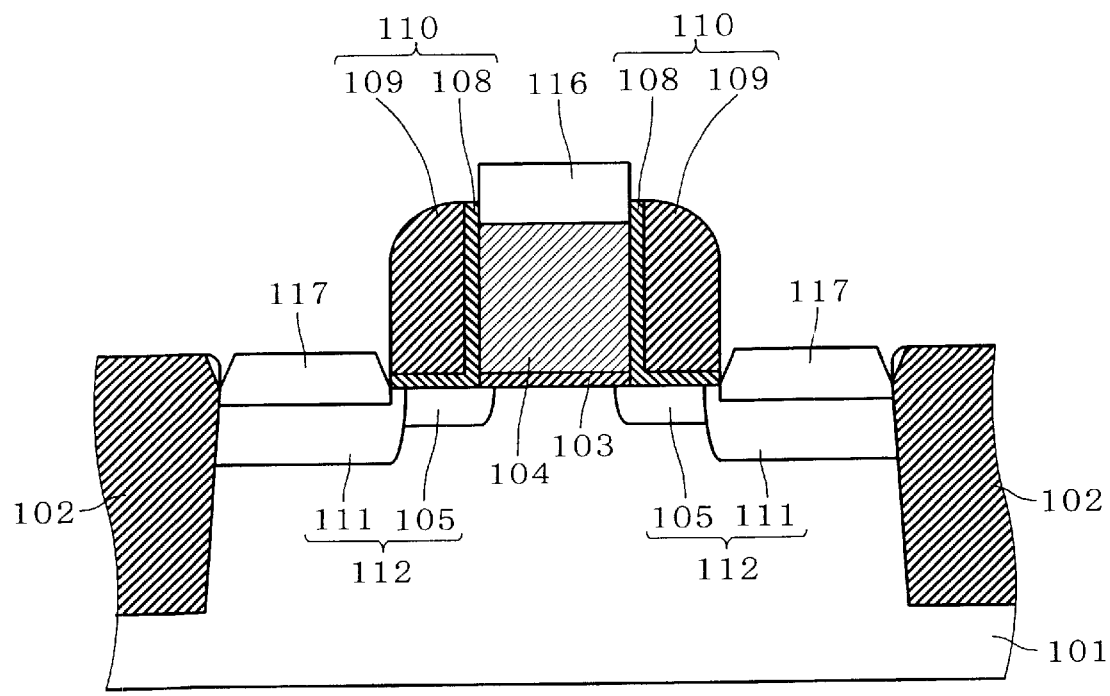
PRIOR ART FIG. 53
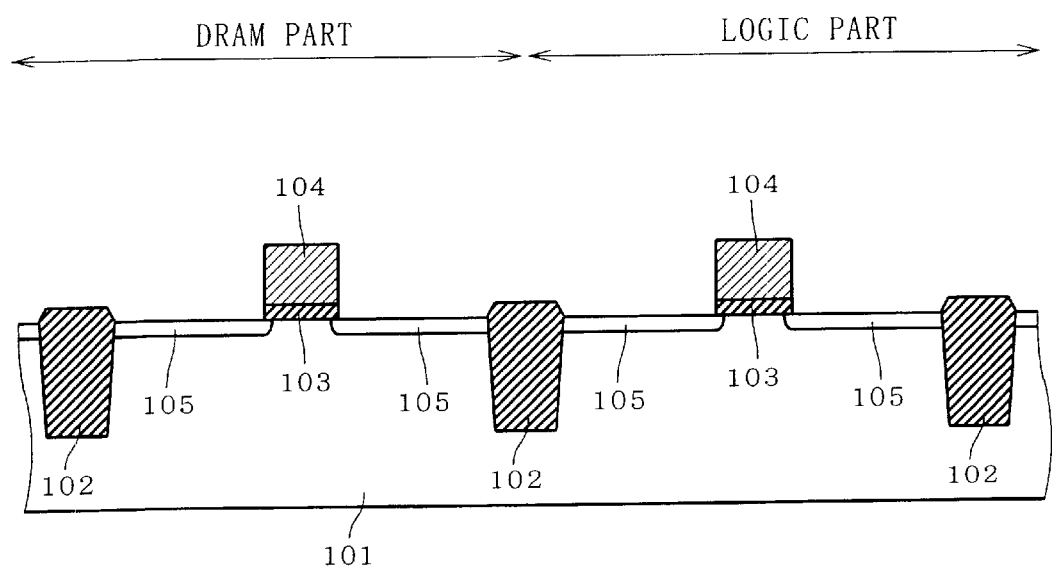

PRIOR ART FIG. 54
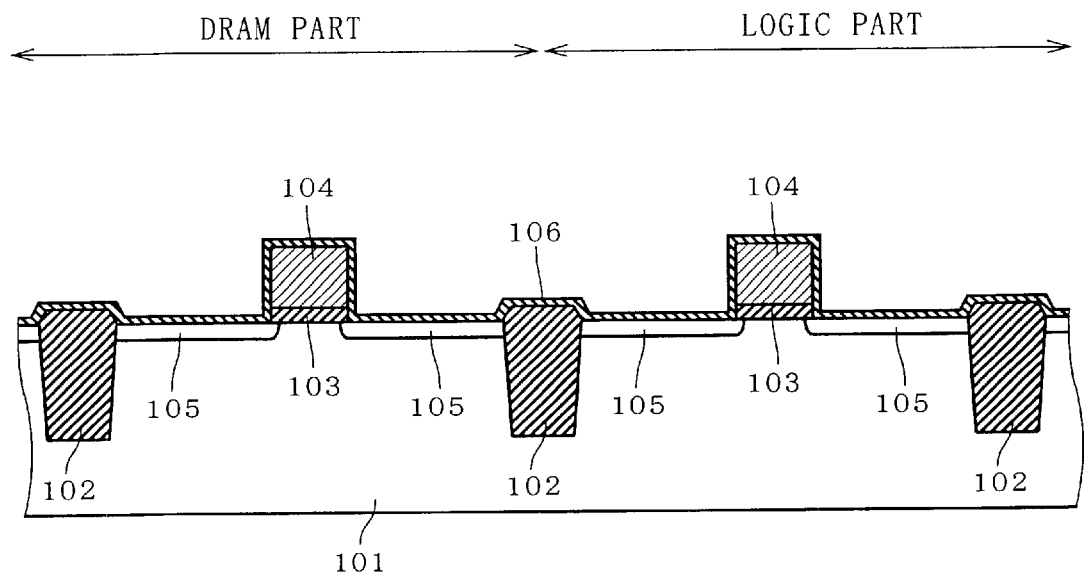
PRIOR ART FIG. 55
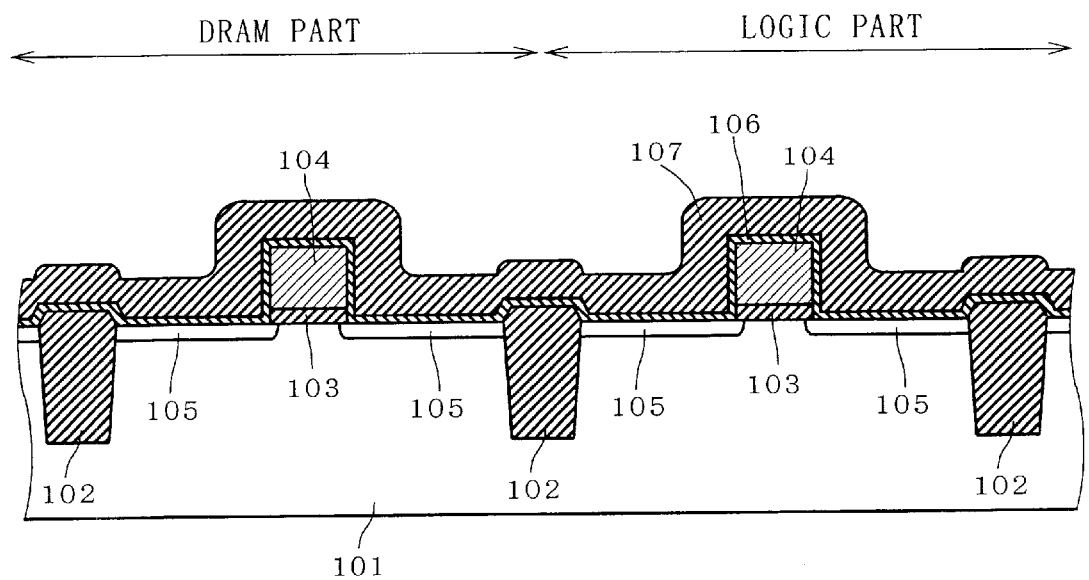

PRIOR ART  F I G . 5 6
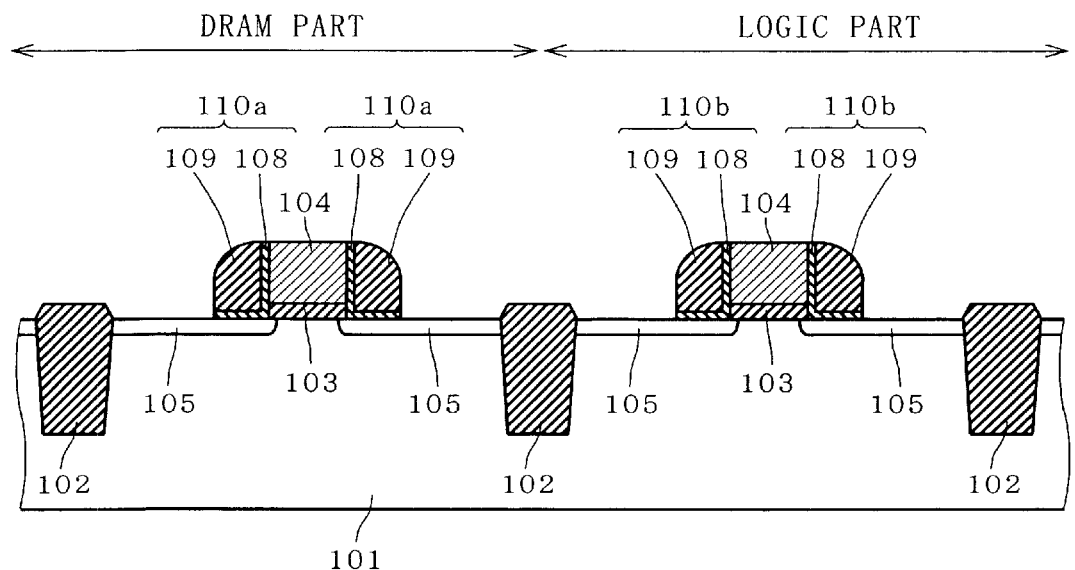
PRIOR ART  F I G . 5 7
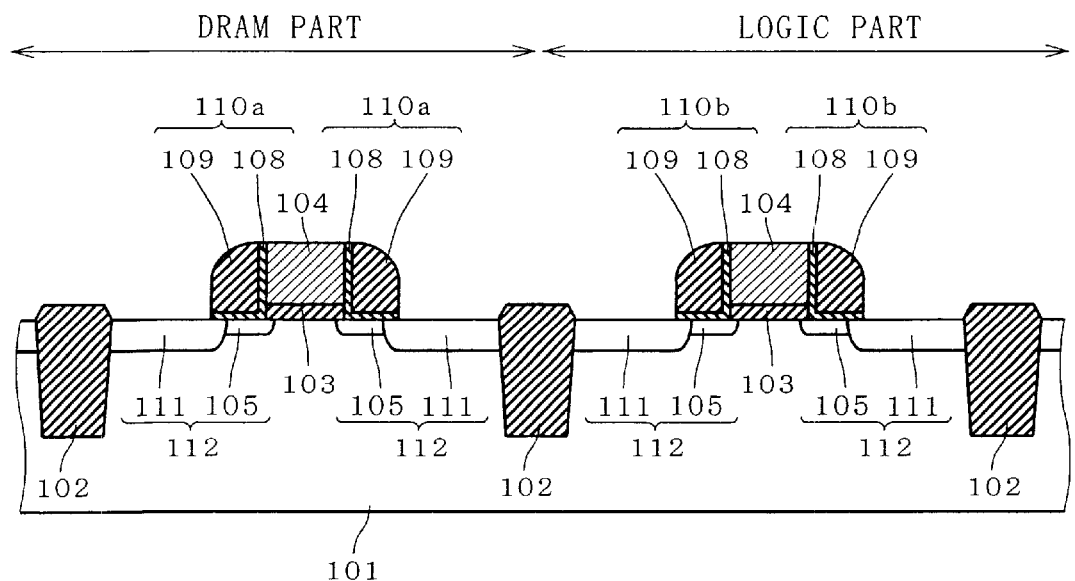

PRIOR ART FIG. 58
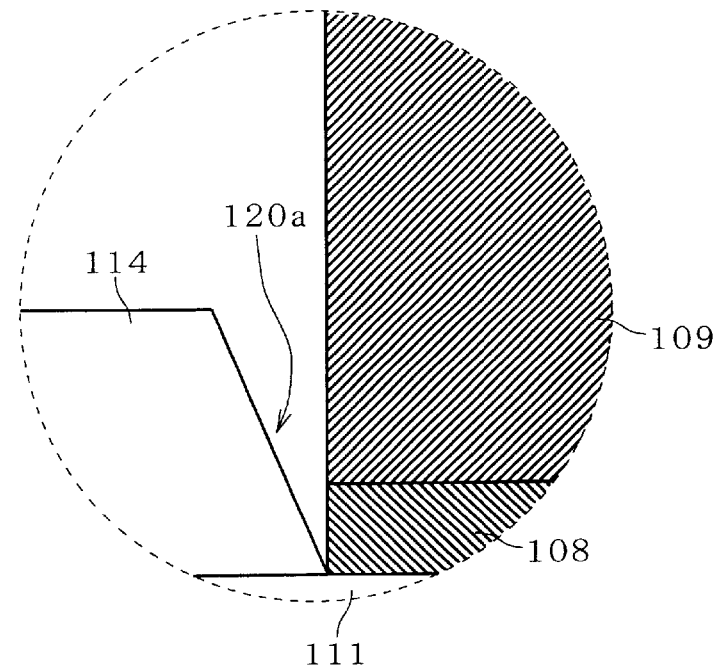
PRIOR ART FIG. 59
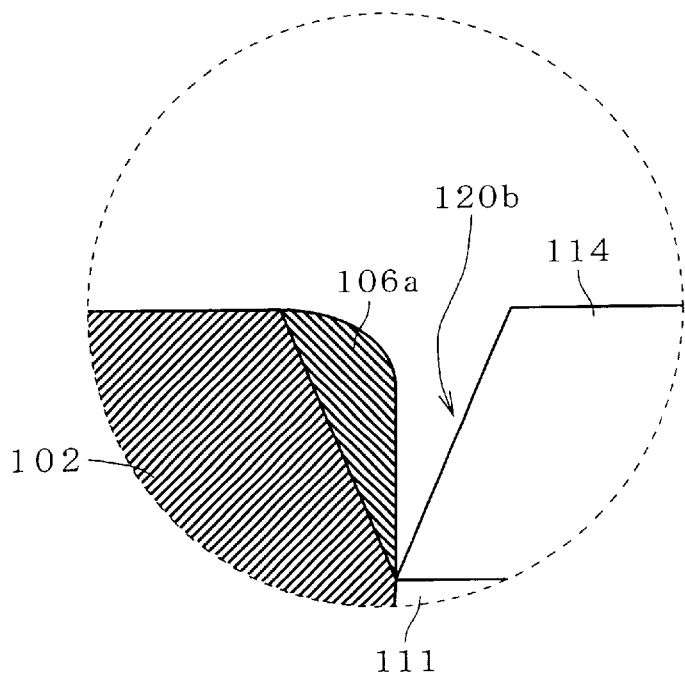

METHOD OF MANUFACTURING SEMICONDUCTOR DEVICE

BACKGROUND OF THE INVENTION

1. Field of the Invention

The present invention relates to a method of manufacturing a semiconductor device, and more particularly, it relates to a method of manufacturing a MOSFET having salicide structure. The present invention also relates to a method of manufacturing a semiconductor device having a plurality of types of semiconductor elements for different applications formed in a single wafer.

2. Description of the Background Art

Background Art 1

FIGS. 46 to 52 are sectional views showing a conventional method of manufacturing a semiconductor device in step order. In particular, these figures successively illustrate steps of manufacturing a MOSFET having a salicide structure. First, element isolation insulative films 102 consisting of silicon oxide are formed on element isolation regions of a silicon substrate 101, thereafter ion implantation is performed for forming a well, a channel (not shown) and the like, and thereafter a gate oxide film 103 consisting of silicon oxide and a gate electrode 104 consisting of polysilicon are selectively formed on an upper surface of the silicon substrate 101. Thereafter ion implantation is performed for forming impurity regions (hereinafter referred to as extensions) 105 in the upper surface of the silicon substrate 101 (FIG. 46).

Then, a silicon oxide film 106 is deposited on the overall surface by CVD, for example, and thereafter a silicon nitride film 107 is deposited on the silicon oxide film 106 (FIG. 47). Then, the silicon nitride film 107 and the silicon oxide film 106 are etched in this order by anisotropic dry etching having a high etching rate along the depth of the silicon substrate 101, to expose the upper surface of the silicon substrate 101. Thus, side walls 110 defined by silicon oxide films 108 and silicon nitride films 109 are formed on side wall portions of the gate electrode 104 (FIG. 48).

Then, ion implantation is performed through the gate electrode 104 and the side walls 110 serving as masks, to form impurity regions 111 in the exposed upper surface of the silicon substrate 101. Consequently, source/drain regions 112 defined by the extensions 105 and the impurity regions 111 are formed in the upper surface of the silicon substrate 101 (FIG. 49).

Then, silicon is grown under conditions having selectivity for a silicon oxide film and a silicon nitride film (this means crystal growth under such conditions that silicon is grown not on a silicon oxide film and a silicon nitride film but on the remaining region) for forming a silicon growth layer 113 on an upper surface of the gate electrode 104 while forming silicon growth layers 114 on the upper surface of the silicon substrate 101 in portions formed with the impurity regions 111 (FIG. 50).

Then, a cobalt layer 115 is deposited on the overall surface by CVD, for example (FIG. 51), and thereafter heat treatment is performed in an inert gas atmosphere of nitrogen, argon or the like. Thus, the cobalt layer 115 reacts with the silicon growth layers 113 and 114, to form cobalt silicide layers 116 and 117. Thereafter unreacted parts of the cobalt layer 115 are removed (FIG. 52). A MOSFET having a salicide structure is manufactured through the aforementioned steps. Thereafter the device is completed through a process including a step of forming an interlayer insulative film, a wiring step and the like.

Background Art 2

FIGS. 53 to 57 are sectional views showing another method of manufacturing a semiconductor device in step order. In particular, these figures successively illustrate steps of manufacturing a semiconductor device having a plurality of types of semiconductor elements for different applications formed in a single wafer. First, element isolation insulative films 102 consisting of silicon oxide are formed on element isolation regions of a silicon substrate 101, thereafter ion implantation is performed for forming a well, a channel (not shown) and the like, and thereafter gate oxide films 103 consisting of silicon oxide and gate electrodes 104 consisting of polysilicon are selectively formed on an upper surface of the silicon substrate 101. Thereafter ion implantation is performed to form extensions 105 in the upper surface of the silicon substrate 101 (FIG. 53).

Then, a silicon oxide film 106 is deposited on the overall surface by CVD, for example (FIG. 54). Thereafter a silicon nitride film 107 is deposited on the silicon oxide film 106 by CVD, for example (FIG. 55). Thereafter the silicon nitride film 107 and the silicon oxide film 106 are etched in this order by anisotropic dry etching having a high etching rate along the depth of the silicon substrate 101, to expose the upper surface of the silicon substrate 101. Thus, side walls 110a defined by silicon oxide films 108 and silicon nitride films 109 are formed on side wall portions of the gate electrode 104 in a DRAM part of the silicon substrate 101, while side walls 110b defined by silicon oxide films 108 and silicon nitride films 109 are formed on side wall portions of the gate electrode 104 in a logic part of the silicon substrate 101 (FIG. 56).

Then, ion implantation is performed through the gate electrodes 104 and the side walls 110a and 110b serving as masks, to form impurity regions 111 in the exposed upper surface of the silicon substrate 101. Consequently, source/drain regions 112 defined by the extensions 105 and the impurity regions 111 are formed in the upper surface of the silicon substrate 101 (FIG. 57). A DRAM-MOSFET and a logic MOSFET are formed on the DRAM part and the logic part of the silicon substrate 101 respectively through the aforementioned steps. Thereafter the device is completed through a process including a step of forming an interlayer insulative film, a wiring step and the like.

Problem related to Background Art 1

In order to increase the operating speed of a MOSFET or improve the high-frequency characteristic thereof, it is also important to reduce gate resistance and source/drain resistance. While the gate resistance is reduced by forming a conductive layer such as the cobalt silicide layer 116 on the gate electrode 104 as in the MOSFET shown in FIG. 52, the gate resistance can be further reduced if the width of the cobalt silicide layer 116 can be increased.

As shown in FIG. 52, however, the width of the cobalt silicide layer 116 is substantially equal to the gate length in the conventional MOSFET, and hence the gate length must be increased in order to increase the width of the cobalt silicide layer 116. If the width of the gate electrode 104 is increased in order to increase the gate length, however, the source-to-drain distance is also increased. Consequently, the channel resistance is increased to reduce the driving current for the MOSFET, to result not only in reduction of the operating speed and the high-frequency characteristic of the MOSFET but also in insufficient satisfaction of requirement for refinement of the device.

FIGS. 58 and 59 are sectional views showing parts A and B in FIG. 50 in an enlarged manner respectively. As hereinabove described, the silicon growth layer 114 is formed by growing silicon on the upper surface of the silicon substrate 101. At this time, a specific plane orientation influences the growth rate, and hence facets appear on end portions of the silicon growth layer 114. FIG. 58 shows a facet 120a appearing on an end portion of the silicon growth layer 114 closer to the side wall 110, while FIG. 59 shows a facet 120b appearing on an end portion of the silicon growth layer 114 closer to the element isolation insulative film 102. A silicon oxide film 106a shown in FIG. 59 is a part of the silicon oxide film 106, deposited on the element isolation insulative film 102, remaining on the side wall portion of the element isolation insulative film 102 in the anisotropic dry etching for forming the side wall 110.

The end portions of the silicon growth layer 114 are smaller in thickness than the central portion due to the presence of the facets 120a and 120b. Silicification of the silicon growth layer 114 for forming the cobalt silicide layer 117 gradually progresses from the interface between the silicon growth layer 114 and the cobalt layer 115, i.e., from an upper surface of the silicon growth layer 114 along the depth. On the end portions of the silicon growth layer 114 having the smaller thickness, therefore, the cobalt silicide layer 117 is formed up to deep portions of the silicon substrate 101 as compared with the central portion having the larger thickness. Thus, the source/drain region 112 must be previously deeply formed so that the parts of the cobalt silicide layer 117 formed in the deep portions of the silicon substrate 101 do not pass through the source/drain region 112. Thus, the source/drain region 112 cannot be much shallowly formed and hence the device is hard to refine in the conventional method of manufacturing a MOSFET.

Problem of Background Art 2

As shown in FIG. 57, the DRAM-MOSFET and the logic MOSFET are formed on the silicon substrate 101 in a hybrid state. Since the DRAM-MOSFET must have stable electric characteristics, the impurity regions 111 preferably separate from each other to some extent in order to reliably form source and drain regions, in consideration of dispersion in process. On the other hand, the logic MOSFET must have high drivability, and hence the distance between the impurity regions 111 is preferably minimized in order to reduce the respective resistance values of the source and drain regions. Thus, the performance required to the DRAM-MOSFET is different from that required to the logic MOSFET, and hence it is preferable if the distances between the impurity regions 111 can be set in the MOSFETs independently of each other.

As shown in FIG. 57, however, the side walls 110a of the DRAM part are equal in width to the side walls 110b of the logic part in the conventional method of manufacturing a semiconductor device. Therefore, the distances between the impurity regions 111 for the source and drain parts thereafter formed by ion implantation are identical to each other in the DRAM part and the logic part. Thus, the conventional method of manufacturing a semiconductor device cannot satisfy the aforementioned requirement.

SUMMARY OF THE INVENTION

According to a first aspect of the present invention, a method of manufacturing a semiconductor device comprises the steps of: (a) selectively forming a multilayer structure of a gate insulator film and a gate electrode stacked in this order on a main surface of a substrate; (b) forming a side wall consisting of at least first and second materials and having an exposure region exposing the second material between a portion of an upper surface of the side wall exposing the first material and an upper surface of the multilayer structure; and (c) forming a conductive layer extending from the exposure region to the upper surface of the multilayer structure.

According to the first aspect of the present invention, a conductive layer having a larger width than the gate electrode can be formed without increasing the width of the gate electrode, for attaining reduction of gate resistance.

According to a second aspect of the present invention, the side wall consists of the first and second materials and a third material, the upper surface of the side wall has a portion exposing the third material between the exposure region and the upper surface of the multilayer structure, and the step (c) is carried out through the steps of: (c-1) growing a semiconductor from each of the exposure region and the upper surface of the multilayer structure thereby forming a semiconductor growth layer extending from the exposure region to the upper surface of the multilayer structure through growth to the direction of the gate length; and (c-2) forming a semiconductor-metal compound by reaction of the semiconductor growth layer with metal, thereby forming the conductive layer in the method of manufacturing a semiconductor device according to the first aspect of the present invention.

According to the second aspect of the present invention, the semiconductor growth layer extending from the exposure region to the upper surface of the multilayer structure is formed through growth to the direction of the gate length and this semiconductor growth layer reacts with the metal to form the semiconductor-metal compound, whereby a conductive layer having a larger width than the gate electrode can be properly formed.

According to a third aspect of the present invention, a method of manufacturing a semiconductor device comprises the steps of: (a) selectively forming a multilayer structure of a gate insulator film and a gate electrode film stacked in this order on a main surface of a substrate; (b) forming a side wall consisting of at least first and second materials and having a first region exposing the second material on a side surface of the side wall in the vicinity of the main surface of the substrate; (c) growing a semiconductor from each of the first region and the exposed main surface of the substrate thereby forming a semiconductor growth layer; and (d) forming a semiconductor-metal compound by reaction of the semiconductor growth layer with metal.

According to the third aspect of the present invention, the semiconductor growth layer is formed by growing the semiconductor not only from the exposed main surface of the substrate but also from the first region of the side wall, whereby occurrence of a facet can be avoided on an end portion of the semiconductor growth layer closer to the gate electrode.

According to a fourth aspect of the present invention, the method of manufacturing a semiconductor device according to the third aspect of the present invention further comprises the steps of: (e) forming an element isolation structure having a projecting part at least partially projecting on the main surface of the substrate in an element isolation region of the substrate; and (f) forming a second region consisting of a third material on a side wall portion of the projecting part, both of which are carried out in advance of the step (c), wherein in the step (c), the semiconductor growth layer is formed by growing the semiconductor from each of the first region, the exposed main surface of the substrate and the second region.

According to the fourth aspect of the present invention, the semiconductor growth layer is formed by growing the semiconductor also from the second region formed on the side wall portion of the projecting part of the element isolation structure, whereby occurrence of a facet can be avoided on an end portion of the semiconductor growth layer closer to the element isolation structure.

According to a fifth aspect of the present invention, a method of manufacturing a semiconductor device comprises the steps of: (a) selectively forming a multilayer structure of a gate insulator film and a gate electrode stacked in this order on a main surface of a substrate; (b) forming a side wall consisting of at least first and second materials and having a first region exposing the second material between a portion of an upper surface of the side wall exposing the first material and an upper surface of the multilayer structure while having a second region exposing the second material on a side surface of the side wall in the vicinity of the main surface of the substrate; (c) growing a semiconductor from each of the first region and the upper surface of the multilayer structure for forming a first semiconductor growth layer extending from the first region to the upper surface of the multilayer structure through growth to the direction of the gate length while growing a semiconductor from each of the second region and the exposed main surface of the substrate thereby forming a second semiconductor growth layer; and (d) forming semiconductor-metal compounds by reaction of the first and second semiconductor growth layers with metal.

According to the fifth aspect of the present invention, gate resistance can be reduced without increasing the width of the gate electrode in relation to the semiconductor device having a salicide structure, while occurrence of a facet can be avoided on an end portion of the second semiconductor growth layer closer to the gate electrode.

According to a sixth aspect of the present invention, the method of manufacturing a semiconductor device according to the fifth aspect of the present invention further comprises the steps of: (e) forming an element isolation structure having a projecting part at least partially projecting on the main surface of the substrate on an element isolation region of the substrate; and (f) forming a third region consisting of a third material on a side wall portion of the projecting part, both of which are carried out in advance of the step (c), wherein in the step (c), the second semiconductor growth layer is formed by growing a semiconductor from each of the second region, the exposed main surface of the substrate and the third region.

According to the sixth aspect of the present invention, gate resistance can be reduced without increasing the width of the gate electrode in relation to the semiconductor device having a salicide structure, while occurrence of a facet can be avoided on an end portion of the second semiconductor growth layer closer to the gate electrode and occurrence of a facet can be avoided also on the end portion of the second semiconductor growth layer closer to the element isolation structure.

According to a seventh aspect of the present invention, a method of manufacturing a semiconductor device comprises the steps of: (a) employing a substrate having a first element forming region for forming a first semiconductor element and a second element forming region for forming a second semiconductor element, to form a first multilayer structure of a gate insulator film and a gate electrode stacked in this order on a main surface of the substrate in the first element forming region and to form a second multilayer structure of a gate insulator film and a gate electrode stacked in this order on a main surface of the substrate in the second element forming region; (b) forming a first side wall having a first width on a side wall portion of the first multilayer structure; (c) forming a second side wall having a second width different from the first width on a side wall portion of the second multilayer structure; and (d) implanting an impurity into the main surface of the substrate through the first and second multilayer structures and the first and second side walls serving as masks thereby forming paired first impurity implantation regions in the main surface of the substrate in the first element forming region and paired second impurity introduction regions in the main surface of the substrate in the second element forming region.

According to the seventh aspect of the present invention, the first and second impurity implantation regions are formed by implanting the impurity through the first and second multilayer structures and the first and second side walls serving as masks respectively, while the widths of the first and second side walls are different from each other. Therefore, the distance between the paired first impurity implantation regions and that between the paired second impurity implantation regions can be set independently of each other in response to the respective applications of the first and second semiconductor elements.

According to an eighth aspect of the present invention, the first side wall consisting of at least first and second materials and having an exposure region exposing the second material between a portion of an upper surface of the side wall exposing the first material and an upper surface of the first multilayer structure is formed in the step (b) in the method of manufacturing a semiconductor device according to the seventh aspect of the present invention, and the method of manufacturing a semiconductor device further comprises the step of: (e) forming a conductive layer extending from the exposure region to the upper surface of the first multilayer structure.

According to the eighth aspect of the present invention, gate resistance of the first semiconductor element can be reduced without increasing the width of the gate electrode in the first multilayer structure.

According to a ninth aspect of the present invention, in the step (c), the side wall is formed through the steps of: (c-1) forming the first side wall on a side wall portion of the second multilayer structure; and (c-2) removing the first material from the first side wall in the method of manufacturing a semiconductor device according to the eighth aspect of the present invention.

According to the ninth aspect of the present invention, the second side wall having a width shorter than the first side wall by that of the first material can be formed on the side wall portion of the second multilayer structure.

According to a tenth aspect of the present invention, a semiconductor device comprises a substrate, a multilayer structure of a gate insulator film and a gate electrode stacked in this order selectively formed on a main surface of the substrate, a side wall, formed on a side wall portion of the multilayer structure, consisting of at least first and second materials and having an exposure region exposing the second material between a portion of an upper surface of the side wall exposing the first material and an upper surface of the multilayer structure, and a conductive layer formed to extend from the exposure region to the upper surface of the multilayer structure.

According to the tenth aspect of the present invention, the width of the conductive layer is larger than that of the gate electrode. Thus, reduction of gate resistance can be attained.

According to an eleventh aspect of the present invention, the side wall according to the tenth aspect consists of the first and second materials and a third material, the upper surface of the side wall has a portion exposing the third material between the exposure region and the upper surface of the multilayer structure, and the conductive layer is a semiconductor-metal compound formed by the reaction of a semiconductor growth layer with metal, the semiconductor growth layer being formed by growing a semiconductor from each of the exposure region and the upper surface of the multilayer structure to extend from the exposure region to the upper surface of the multilayer structure through growth to the direction of the gate length.

According to the eleventh aspect of the present invention, the semiconductor growth layer extending from the exposure region to the upper surface of the multilayer structure is formed through growth to the direction of the gate length and this semiconductor growth layer reacts with the metal to form the semiconductor-metal compound, whereby a conductive layer having a larger width than the gate electrode can be properly formed.

According to a twelfth aspect of the present invention, a semiconductor device comprises a substrate, a multilayer structure of a gate insulator film and a gate electrode stacked in this order selectively formed on a main surface of the substrate, a side wall, formed on a side wall portion of the multilayer structure, consisting of at least first and second materials and having a first region exposing the second material on a side surface of the side wall in the vicinity of the main surface of the substrate, and a conductive layer consisting of a semiconductor-metal compound formed by the reaction of a semiconductor growth layer with metal, the semiconductor growth layer being formed by growing a semiconductor from each of the first region and the exposed main surface of the substrate.

According to the twelfth aspect of the present invention, the semiconductor growth layer is formed by growing the semiconductor not only from the exposed main surface of the substrate but also from the first region of the side wall. Therefore, occurrence of a facet can be avoided on an end portion of the semiconductor growth layer closer to the gate electrode.

According to a thirteenth aspect of the present invention, the semiconductor device according to the twelfth aspect of the present invention further comprises an element isolation structure, formed on an element isolation region of the substrate, having a projecting part at least partially projecting on the main surface of the substrate, and a second region consisting of a third material formed on a side wall portion of the projecting part, and the semiconductor growth layer is formed by growing a semiconductor from each of the first region, the exposed main surface of the substrate and the second region.

According to the thirteenth aspect of the present invention, the semiconductor growth layer is formed by growing the semiconductor from each of the exposed main surface of the substrate, the first region of the side wall and the second region formed on the side wall portion of the projecting part of the element isolation structure. Therefore, occurrence of a facet can be avoided on an end portion of the semiconductor growth layer closer to the element isolation structure. Thus, a source/drain region can be shallowly formed in the substrate, thereby obtaining a refined semiconductor device.

According to a fourteenth aspect of the present invention, a semiconductor device comprises a substrate, a multilayer structure of a gate insulator film and a gate electrode stacked in this order selectively formed on a main surface of the substrate, a side wall, formed on a side wall portion of the multilayer structure, consisting of at least first and second materials and having a first region exposing the second material between a portion of an upper surface of the side wall exposing the first material and an upper surface of the multilayer structure while having a second region exposing the second material in a side surface of the side wall in the vicinity of the main surface of the substrate, a first conductive layer consisting of a first semiconductor-metal compound formed by the reaction of a first semiconductor growth layer with metal, the first semiconductor growth layer being formed by growing a semiconductor from each of the first region and the upper surface of the multilayer structure to extend from the first region to the upper surface of the multilayer structure through growth to the direction of the gate length, and a second conductive layer consisting of a second semiconductor metal compound formed by the reaction of a second semiconductor growth layer with metal, the second semiconductor growth layer being formed by growing a semiconductor from each of the second region and the exposed main surface of the substrate.

According to the fourteenth aspect of the present invention, gate resistance can be reduced without increasing the width of the gate electrode in relation to the semiconductor device having a salicide structure while occurrence of a facet can be avoided on an end portion of the second semiconductor growth layer closer to the gate electrode.

According to a fifteenth aspect of the present invention, the semiconductor device according to the fourteenth aspect of the present invention further comprises an element isolation structure, formed on an element isolation region of the substrate, having a projecting part at least partially projecting on the main surface of the substrate, and a third region consisting of a third material formed on a side wall portion of the projecting part, and the second semiconductor growth layer is formed by growing the semiconductor from each of the second region, the exposed main surface of the substrate and the third region.

According to the fifteenth aspect of the present invention, gate resistance can be reduced without increasing the width of the gate electrode in relation to the semiconductor device having a salicide structure while occurrence of a facet can be avoided on an end portion of the second semiconductor growth layer closer to the gate electrode and occurrence of a facet can be avoided also on an end portion of the semiconductor growth layer closer to the element isolation structure. Therefore, a source/drain region can be shallowly formed in the substrate, and a refined semiconductor device can be obtained.

According to a sixteenth aspect of the present invention, a semiconductor device comprises a substrate having a first element forming region for forming a first semiconductor element and a second element forming region for forming a second semiconductor element, a first multilayer structure of a gate insulator film and a gate electrode stacked in this order selectively formed on a main surface of the substrate in the first element forming region, a second multilayer structure of a gate insulator film and a gate electrode stacked in this order selectively formed on a main surface of the substrate in the second element forming region, a first side wall having a first width formed on a side wall portion of the first multilayer structure, a second side wall having a second width different from the first width formed on a side wall portion of the second multilayer structure, paired first impurity implantation regions formed by implanting an impurity into the main surface of the substrate in the first element forming region through the first multilayer structure and the first side wall serving as masks and paired second impurity implantation regions formed by implanting an impurity into the main surface of the substrate in the second element forming region through the second multilayer structure and the second side wall serving as masks.

According to the sixteenth aspect of the present invention, the first and second impurity regions are formed by implanting the impurity through the first and second multilayer structures and the first and second side walls serving as masks respectively, while the widths of the first and second side walls are different from each other. Therefore, the distance between the paired first impurity implantation regions and that between the paired second impurity implantation regions can be set independently of each other in response to the respective applications of the first and second semiconductor elements.

According to a seventeenth aspect of the present invention, the first side wall consists of at least first and second materials and has an exposure region exposing the second material between a portion of an upper surface of the first side wall exposing the first material and an upper surface of the first multilayer structure in the semiconductor device according to the sixteenth aspect of the present invention, and the semiconductor device further comprises a conductive layer formed to extend from the exposure region to the upper surface of the first multilayer structure.

According to the seventeenth aspect of the present invention, gate resistance of the first semiconductor element can be reduced without increasing the width of the gate electrode in the first multilayer structure.

According to an eighteenth aspect of the present invention, the second side wall is formed by removing the first material from the first side wall formed on a side wall portion of the second multilayer structure in the semiconductor device according to the seventeenth aspect of the present invention.

According to the eighteenth aspect of the present invention, the second side wall having a width shorter than the first side wall by the width of the first material can be formed on the side wall portion of the second multilayer structure.

A first object of the present invention is to obtain a method of manufacturing a semiconductor device which can reduce gate resistance by increasing the width of a conductive layer formed on a gate electrode without increasing the gate length in relation to a MOSFET having a salicide structure, and to obtain a method of manufacturing a semiconductor device suitable for refinement which enables formation of a shallow source/drain region by preventing a conductive layer formed on the source/drain region of a substrate from reaching a deep portion of the substrate. A second object of the present invention is to obtain a method of manufacturing a semiconductor device which can set distances between impurity regions of source parts and those in drain parts independently of each other in response to required performance in relation to a semiconductor device having a plurality of types of semiconductor elements for different applications formed in a single wafer.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 46 to 57 are sectional views showing a conventional method of manufacturing a semiconductor device in step order;

FIG. 58 is a sectional view showing a part A in FIG. 50 in an enlarged manner; and FIG. 59 is a sectional view showing a part B in FIG. 50 in an enlarged manner.

DESCRIPTION OF THE PREFERRED EMBODIMENTS

Embodiment 1

Figure 1:
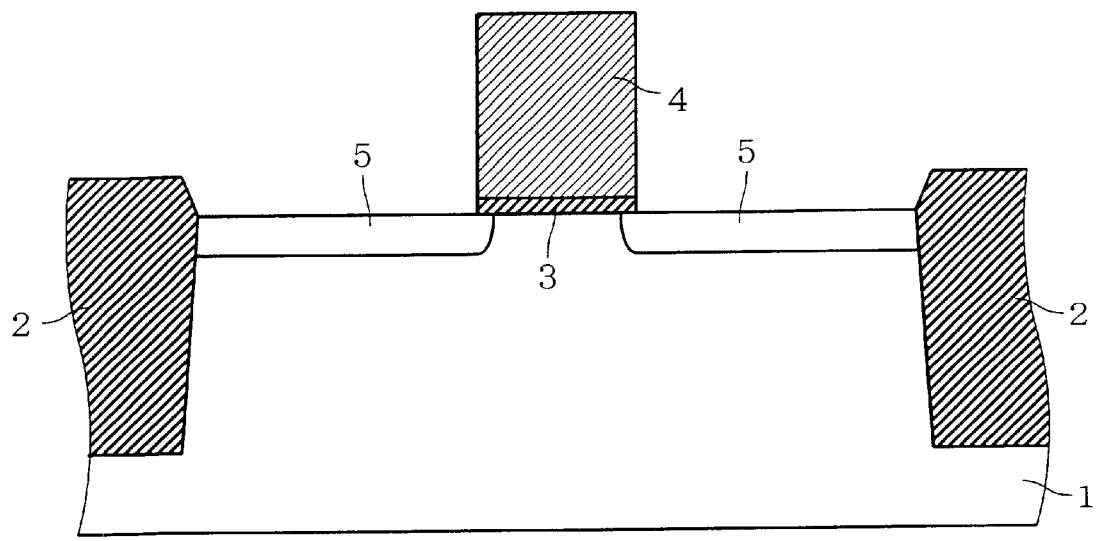
FIGS. 1 to 9 are sectional views showing a method of manufacturing a semiconductor device according to an embodiment 1 of the present invention in step order.

FIGS. 1 to 9 are sectional views showing a method of manufacturing a semiconductor device according to an embodiment 1 of the present invention in step order. First, element isolation insulative films 2 consisting of silicon oxide or silicon oxynitride are formed on element isolation regions of a silicon substrate 1, thereafter ion implantation is performed for forming a well, a channel (not shown) and the like, and thereafter a multilayer structure of a gate oxide film 3 and a gate electrode 4 stacked in this order is selectively formed on an upper surface of the silicon substrate 1. The gate oxide 3 consists of silicon oxide, for example, and the gate electrode 4 consists of polysilicon, for example. The width (substantially equal to the gate length) of the gate electrode 4 is about 0.1 $\mu$m. Thereafter ion implantation is performed through the gate electrode 4 serving as a mask, to form extensions 5 in the upper surface of the silicon substrate 1 (FIG. 1).

Figure 2:
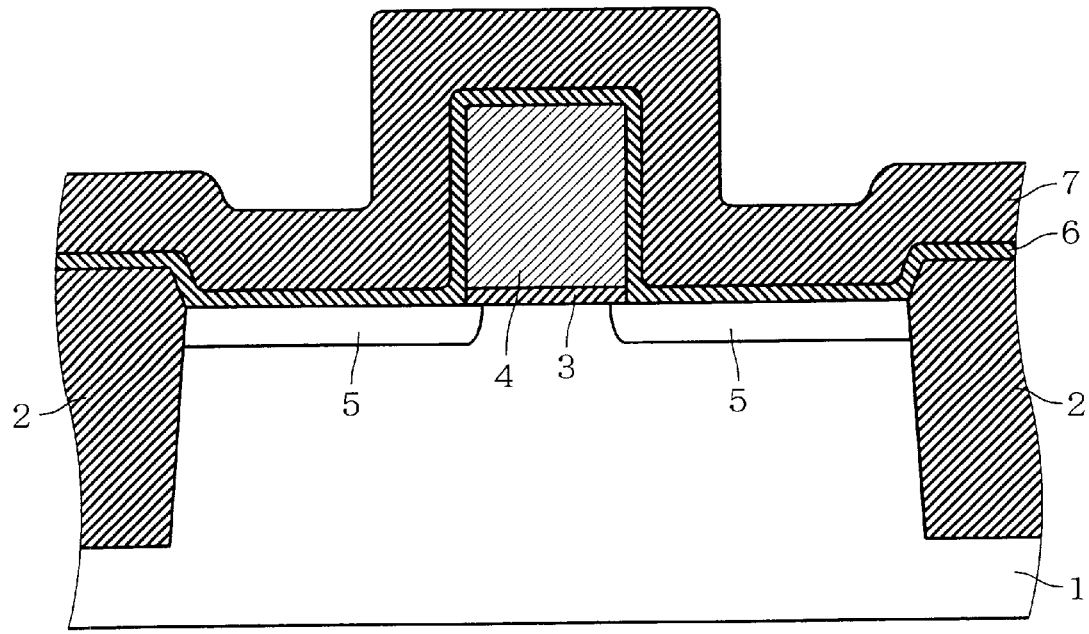

Then, a silicon oxide film 6 is deposited on the overall surface by CVD, for example, and thereafter a silicon nitride film 7 is deposited on the silicon oxide film 6 (FIG. 2). The silicon oxide film 6, which is an underlayer oxide film for preventing the silicon nitride film 7 from coming into contact with the silicon substrate 1, may be about 0.01 $\mu$m in thickness. When forming silicon growth layers 15 and 16 described later in a thickness of about 0.1 $\mu$m, however, the silicon oxide film 6 can be formed in a thickness of about 0.05 $\mu$m at the maximum. The silicon nitride film 7 may be deposited in a thickness of about 0.05 $\mu$m.

Figure 3:
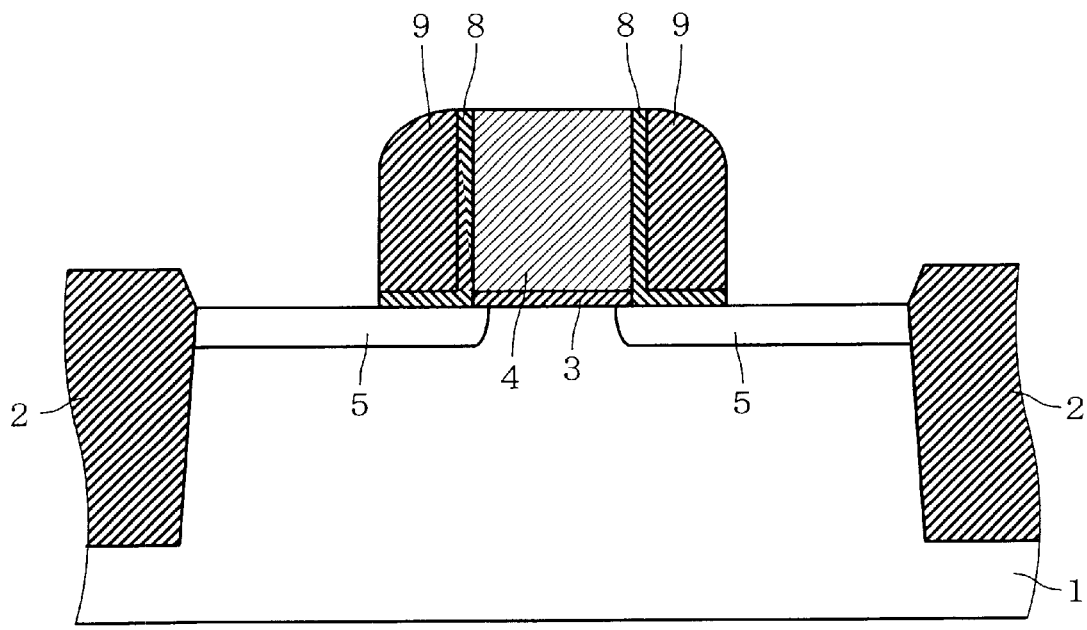

Then, the silicon nitride film 7 and the silicon oxide film 6 are etched in this order by anisotropic dry etching having a high etching rate along the depth of the silicon substrate 1, to expose the upper surface of the silicon substrate 1. At this time, silicon nitride films 9 and silicon oxide films 8 remain on side wall portions of the gate electrode 4 (FIG. 3).

Figure 4:
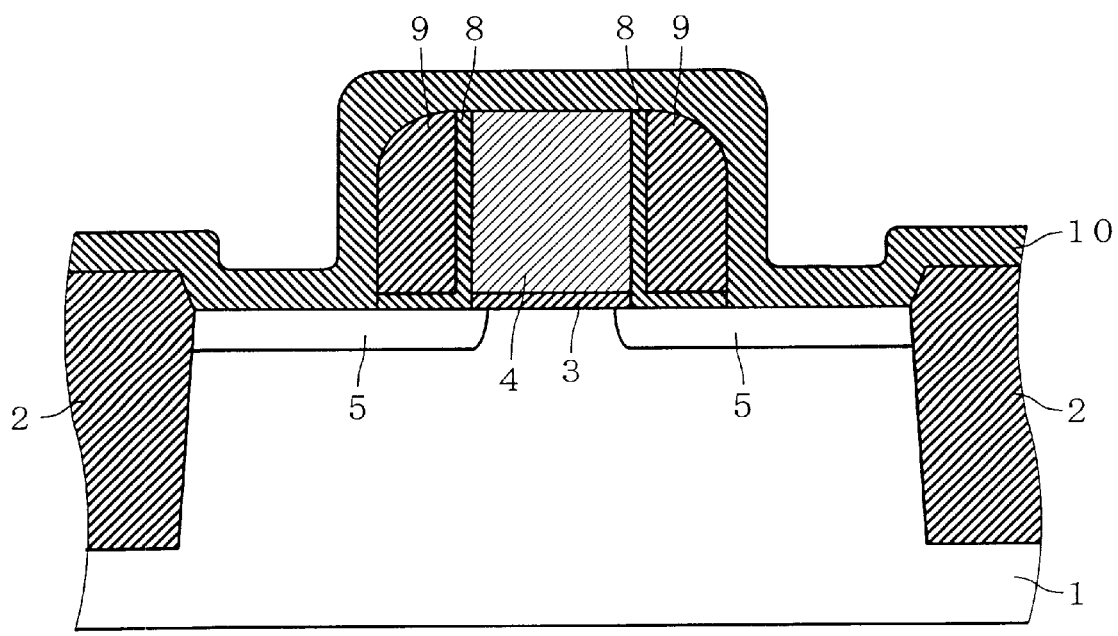
Figure 5:
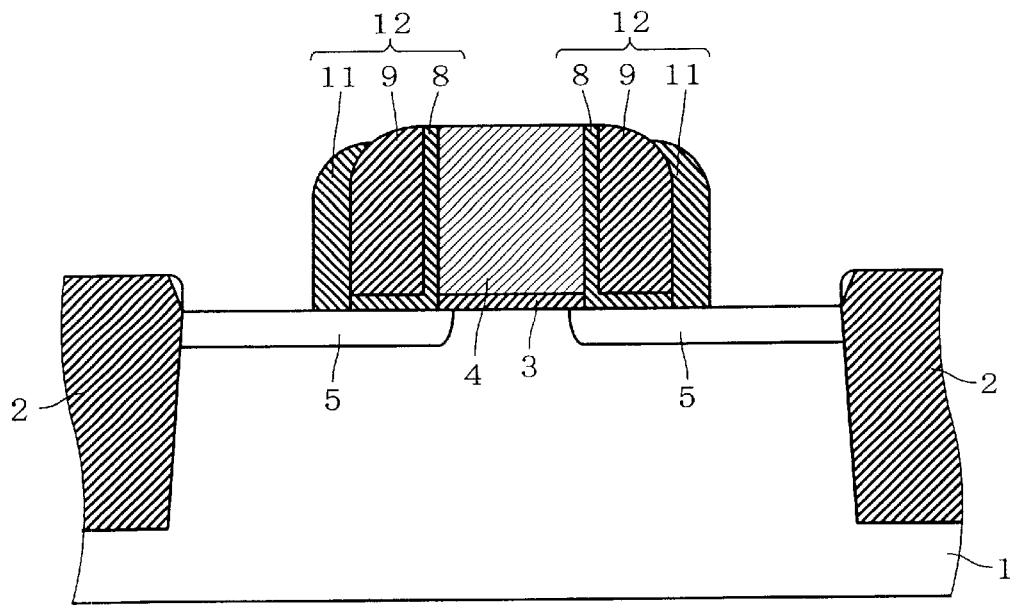

Then, a silicon oxide film 10 of about 0.05 μm in thickness is deposited on the overall surface by CVD, for example (FIG. 4). Then, the silicon oxide film 10 is etched by anisotropic dry etching having a high etching rate along the depth of the silicon substrate 1, to expose the upper surface of the silicon substrate 1. Thus, side walls 12 defined by the silicon oxide films 8 and 11 and the silicon nitride films 9 are formed on the side wall portions of the gate electrode 4 (FIG. 5).

Figure 6:
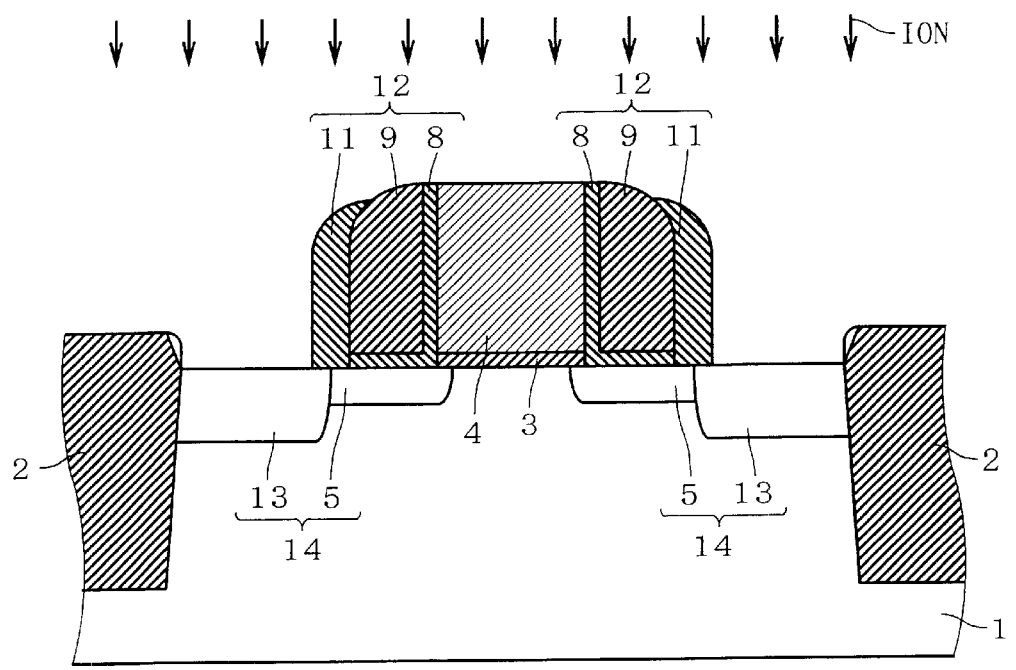

Then, ion implantation is performed through the gate electrode 4 and the side walls 12 serving as masks, to form impurity regions 13 in the exposed upper surface of the silicon substrate 1. Consequently, source/drain regions 14 defined by the extensions and the impurity regions 13 are formed in the upper surface of the silicon substrate 1 (FIG. 6).

Then, silicon is grown under conditions having selectivity for a silicon oxide film. This means silicon growth under such conditions that silicon is grown not on a silicon oxide film but on the remaining region. Conceivable conditions are employment of disilane gas, a flow rate of 0.1 to 2 sccm, a temperature of 550 to 700° C., a pressure of $1 \times 10^{-5}$ to $1 \times 10^{-4}$ Torr and the like, for example. While silicon is grown under the conditions having selectivity also for a silicon nitride in the background art, chlorine gas or the like must be employed for attaining the selectivity for a silicon nitride film. Therefore, the process according to the embodiment 1 with no selectivity for a silicon nitride film is simpler than that in the background art.

Figure 7:
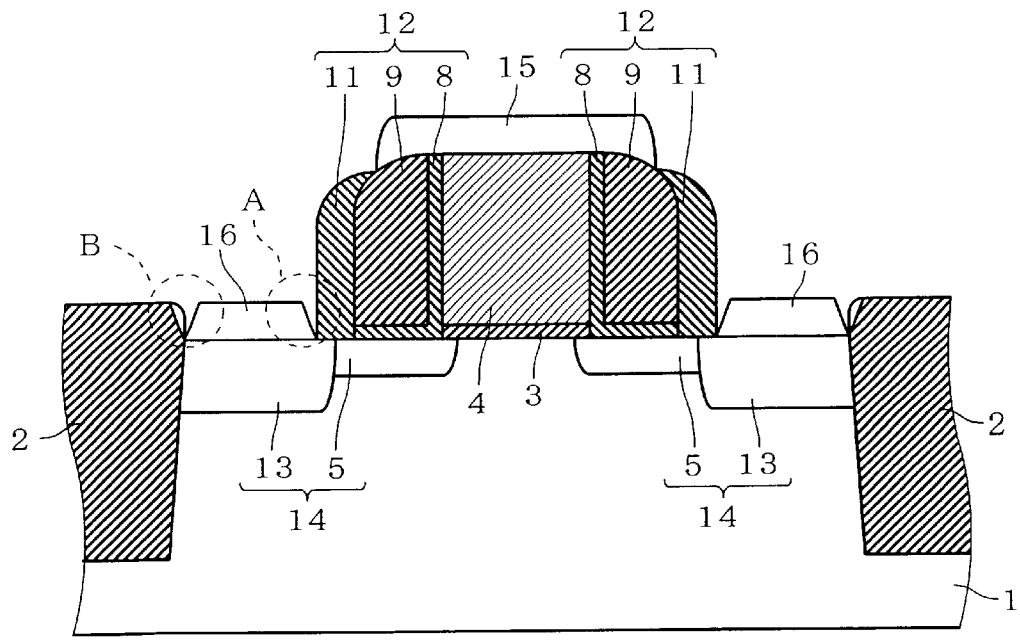
Figure 8:
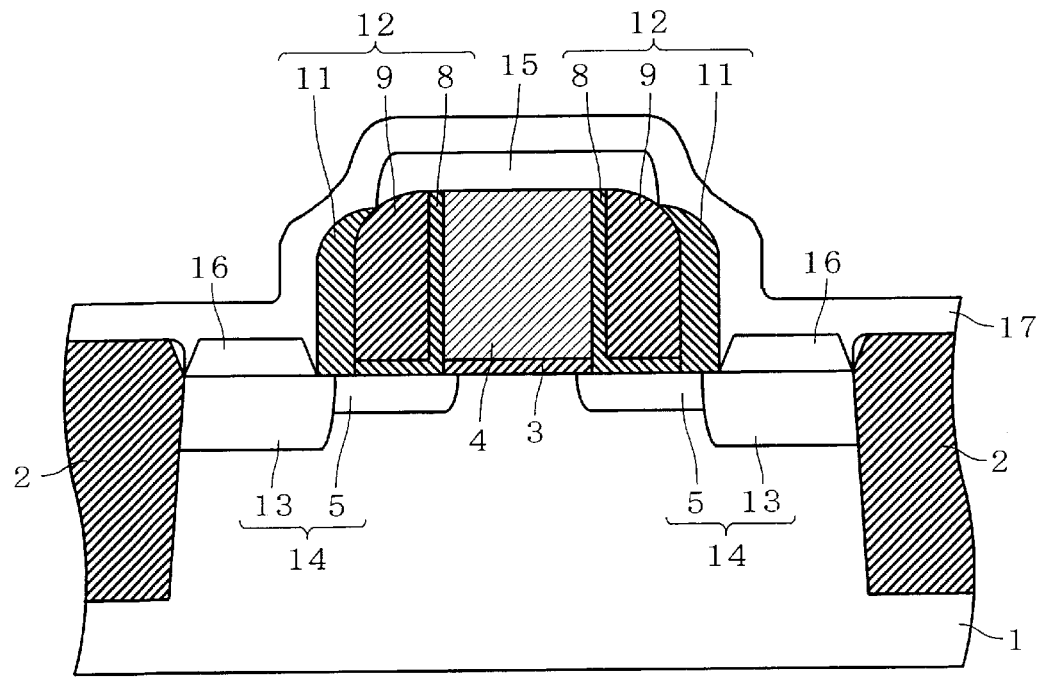

Thus, silicon is grown on upper surfaces of the silicon nitride films 9, the upper surface of the gate electrode 4 and the upper surface of the silicon substrate 1 in the portions formed with the impurity regions 13 respectively (FIG. 7). As shown in FIG. 7, upper surfaces of the silicon oxide films 8 are present between the upper surfaces of the silicon nitride films 9 and that of the gate electrode 4. However, the silicon is grown not only along the normal direction of the upper surface of the gate electrode 4 but also in the direction of the gate length (corresponding to the horizontal direction of the plane of FIG. 7). By such silicon growth to the direction of the gate length, therefore, the silicon grown on the upper surfaces of the silicon nitride films 9 comes into contact with that grown on the upper surface of the gate electrode 4. Consequently, a silicon growth layer 15 extending from the upper surfaces of the silicon nitride films 9 to that of the gate electrode 4 can be formed. Further, silicon growth layers 16 are formed on the upper surface of the silicon substrate 1 in the portions formed with the impurity regions 13. The silicon growth layers 15 and 16 may sufficiently be about 0.1 μm in thickness. Side surfaces of the silicon nitride films 9 opposite to the gate electrode 4 are covered with the silicon oxide films 11, to allow no growth of silicon. In other words, the silicon oxide films 11 have a function of preventing the silicon growth layer 15 from coming into contact with the silicon growth layers 16.

Figure 9:
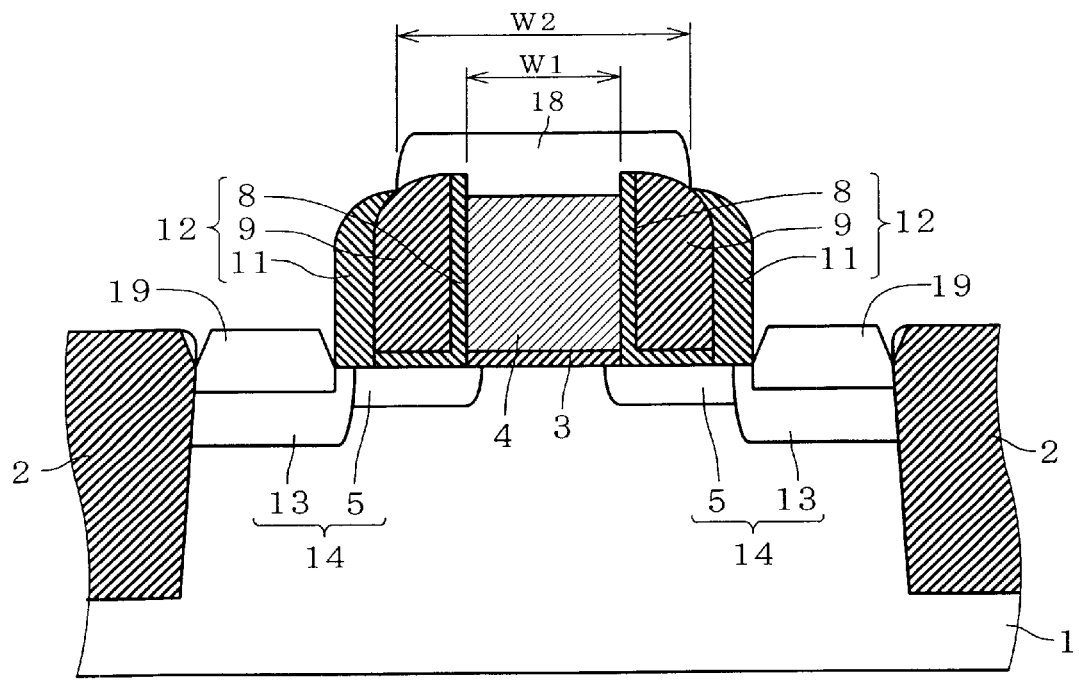

Then, a cobalt layer 17 is deposited on the overall surface by CVD, for example (FIG. 8), and thereafter heat treatment is performed in an inert gas atmosphere of nitrogen or argon. Thus, the cobalt layer 17 reacts with the silicon growth layers 15 and 16, to form cobalt silicide layers 18 and 19. Thereafter unreacted parts of the cobalt layer 17 are removed from portions not in contact with the silicon growth layers 15 and 16 (FIG. 9). A MOSFET having a salicide structure is manufactured through the aforementioned steps. Thereafter the device is completed through a process including a step of forming an interlayer insulative film, a wiring step and the like.

In the method of manufacturing a semiconductor device according to the embodiment 1, the cobalt silicide layer 18 having a width W2 wider than the width W1 of the gate electrode 4 can be formed on the gate electrode 4 (FIG. 9). The resistance value of the cobalt silicide layer 18 is sufficiently smaller than that of polysilicon forming the gate electrode 4, whereby gate resistance is substantially decided by the width and the thickness of the cobalt silicide layer 18. If the gate length W1 is 0.1 μm, the width of the side walls 12 is 0.05 μm and the width of the silicon oxide films 11 is 0.005 μm (this thickness is sufficient in consideration of the aforementioned function of the silicon oxide films 11), for example, the width W2 of the cobalt silicide layer 18 is about 0.19 μm, which is longer by 0.09 μm than the gate length W1. Thus, the gate resistance can be reduced substantially by half. In the method of manufacturing a semiconductor device according to the embodiment 1, therefore, the gate resistance can be reduced without increasing the gate length.

In relation to the structure of the side walls 12, portions exposing the upper surfaces of the silicon oxide films 8 may not necessarily be present between portions of the upper surfaces of the side walls 12 exposing the upper surfaces of the silicon nitride films 9 and the upper surface of the gate electrode 4. As to the structure of the side walls 12, therefore, at least portions exposing the silicon nitride films 9 and those exposing the silicon oxide films 11 outside the portions may be present in the upper surfaces of the side walls 12.

Modifications of the method of manufacturing a semiconductor device according to the embodiment 1 are now described. The following modifications are also applicable to the remaining embodiments of the present invention described later, unless otherwise stated.

In general silicon growth, a silicon growth layer consisting of polysilicon is formed when growing silicon on polysilicon, while a silicon growth layer consisting of single-crystalline silicon is formed when growing silicon on single-crystalline silicon. According to the above description, therefore, it follows that the silicon growth layer 15 is made of polysilicon and the silicon growth layers 16 are made of single-crystalline silicon. However, the form of silicon is not restricted but any of single-crystalline silicon, polysilicon and amorphous silicon is employable. While the silicon growth layers 15 and 16 are silicified into conductive layers in the above description, conductive layers may alternatively be formed by doping the silicon growth layers 15 and 16 with an impurity in a step after forming the silicon growth layers 15 and 16.

The cobalt silicide layers 18 and 19 may be replaced with layers of another silicide such as titanium silicide, nickel silicide, tungsten silicide or the like. In place of the series of steps of forming the silicon growth layers 15 and 16 and thereafter silicifying the same, metal such as molybdenum or tungsten may be grown under conditions having selectivity for a silicon oxide film. In this case, the silicifying step can be omitted.

The silicon growth layers 15 and 16 may be made of germanium or a compound of silicon and germanium.

As shown in FIG. 9, for example, the side surfaces of the silicon nitride films 9 opposite to the gate electrode 4 are covered with the silicon oxide films 11, which are insulator films. Also when forming other insulator films such as silicon oxynitride films, semiconductor films of polysilicon, germanium or silicon germanium or films of silicide or metal in place of the silicon nitride films 9, therefore, no shorting is caused between the gate electrode 4 and the source/drain regions 14. In relation to an embodiment 2 described later, however, no conductor films of silicide or metal can be formed in place of such silicon nitride films 9.

In relation to the upper surface structure of the side walls 12, upper surfaces of the exposed portions of the silicon nitride films 9 may not necessarily flush with upper surfaces of the exposed portions of the silicon oxide films 8 and 11. When the upper surfaces of the exposed portions of the silicon nitride films 9 are depressed as compared with those of the exposed portions of the silicon oxide films 8 and 11, the effective width of the cobalt silicide layer 18 formed later can be increased to further reduce the gate resistance.

Embodiment 2

Figure 10:
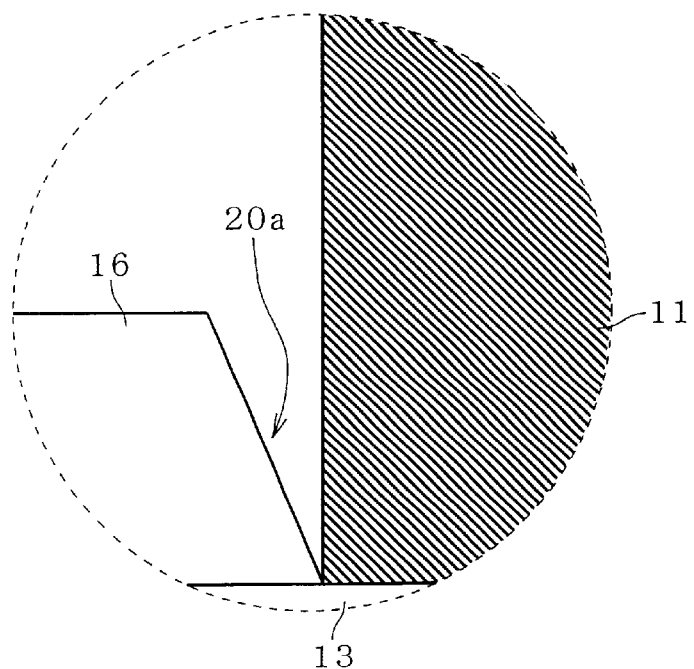
FIG. 10 is a sectional view showing a part A in FIG. 7 in an enlarged manner.

FIG. 10 is a sectional view showing a part A in FIG. 7 in an enlarge manner. A facet 20a appears on an end portion of the silicon growth layer 16 closer to the gate electrode 4. In an embodiment 2 of the present invention, a method of manufacturing a semiconductor device capable of avoiding occurrence of such a facet 20a is proposed.

Figure 11:
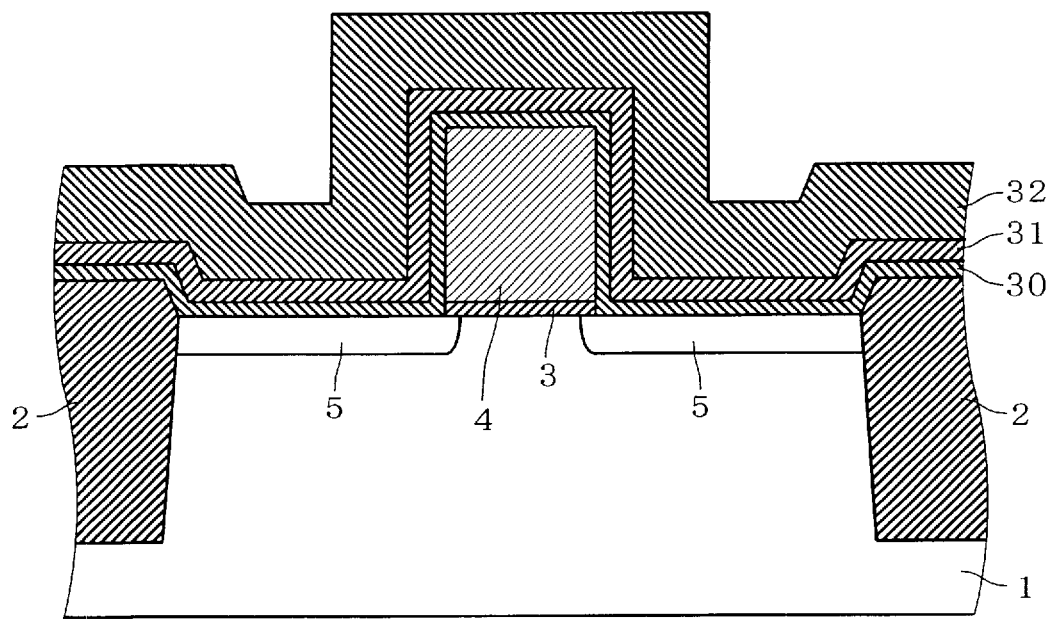
FIGS. 11 to 16 are sectional views showing a method of manufacturing a semiconductor device according to an embodiment 2 of the present invention in step order.

FIGS. 11 to 16 are sectional views showing the method of manufacturing a semiconductor device according to the embodiment 2 of the present invention in step order. First, a structure similar to that shown in FIG. 1 is obtained by a method similar to that in the embodiment 1, and thereafter a silicon oxide film 30 is deposited on the overall surface by CVD, for example. Thereafter a silicon nitride film 31 is deposited on the silicon oxide film 30 and a silicon oxide film 32 is deposited on the silicon nitride film 31 respectively by CVD, for example (FIG. 11).

Figure 12:
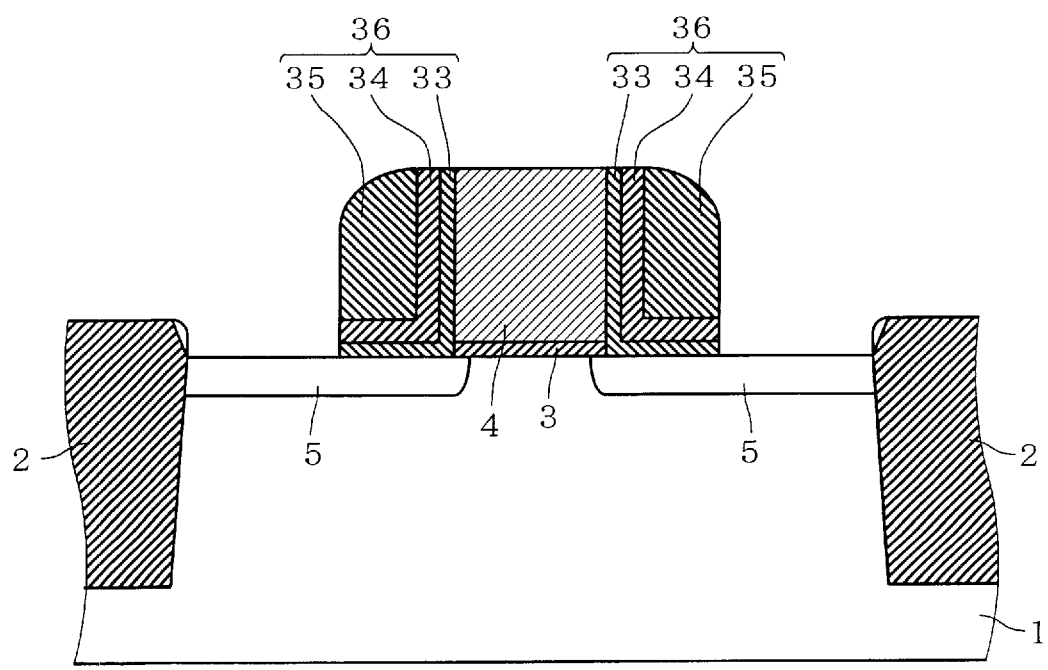

Then, the silicon oxide film 32, the silicon nitride film 31 and the silicon oxide film 30 are etched in this order by anisotropic dry etching having a high etching rate along the depth of a silicon substrate 1, to expose an upper surface of the silicon substrate 1. Thus, side walls 36 defined by silicon oxide films 33 and 35 and silicon nitride films 34 are formed on side wall portions of a gate electrode 4 (FIG. 12). As shown in FIG. 12, portions exposing side surfaces of the silicon nitride films 34 are present on side surfaces of the side walls 36 opposite to the gate electrode 4 around the upper surface of the silicon substrate 1. Further, portions exposing upper surfaces of the silicon nitride films 34 and those exposing the silicon oxide films 35 in regions opposite to the gate electrode 4 beyond the portions are present on upper surfaces of the side walls 36.

Figure 13:
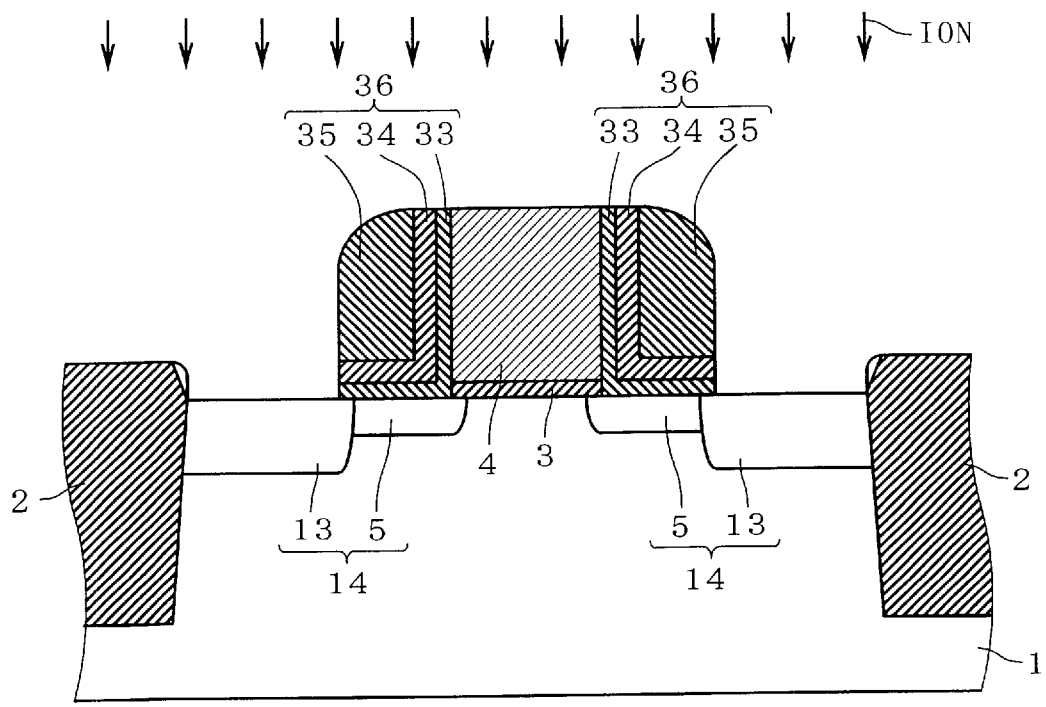

Then, ion implantation is performed through the gate electrode 4 and the side walls 36 serving as masks, to form impurity regions 13 in the exposed upper surface of the silicon substrate 1. Consequently, source/drain regions 14 defined by extensions 5 and the impurity regions 13 are formed in the upper surface of the silicon substrate 1 (FIG. 13).

Figure 14:
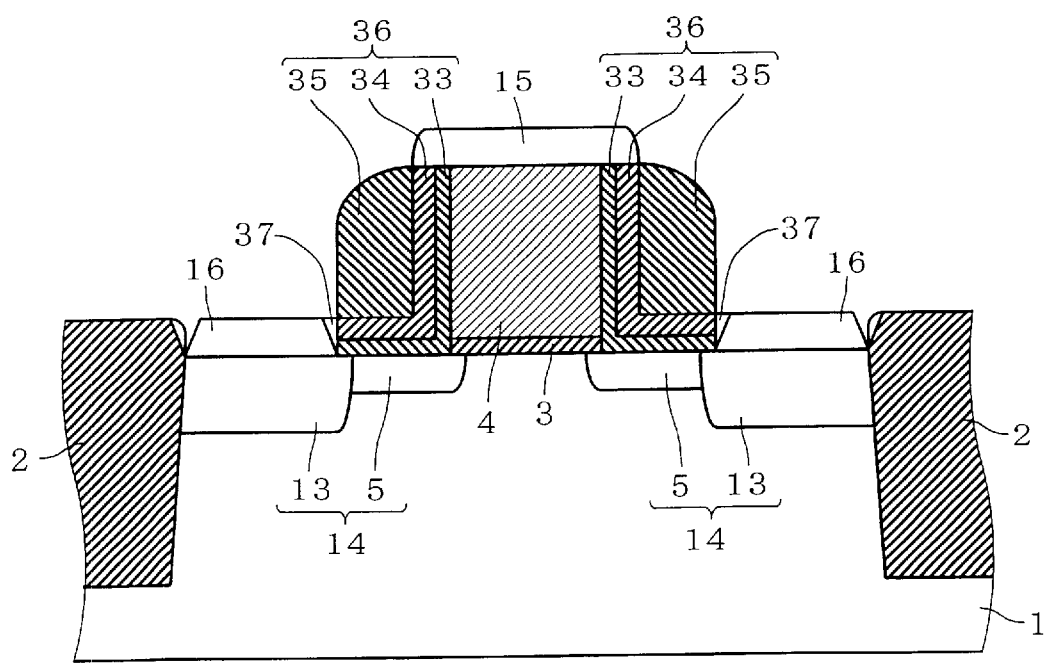
Figure 15:
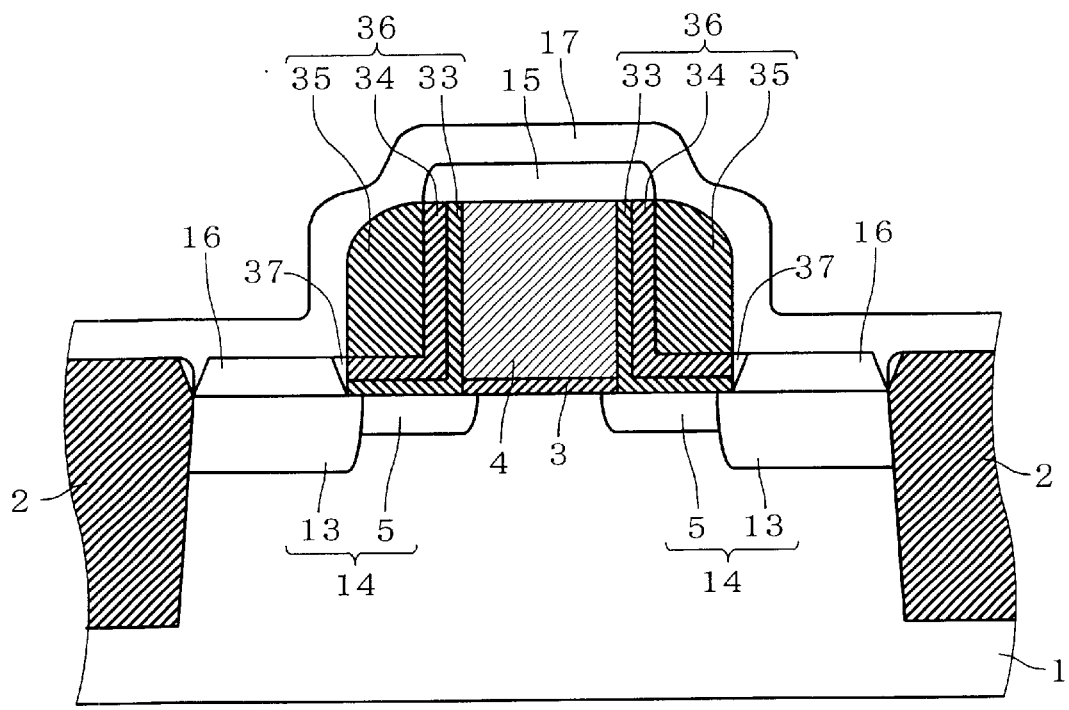

Then, silicon is grown under conditions having selectivity for a silicon oxide film similarly to the embodiment 1. Thus, silicon is grown on the upper surfaces of the silicon nitride films 34, the upper surface of the gate electrode 4, the upper surface of the silicon substrate 1 in portions formed with the impurity regions 13, and the side surfaces of the silicon nitride films 34 exposed on the side surfaces of the side walls 36 respectively (FIG. 14). As shown in FIG. 14, upper surfaces of the silicon oxide films 33 are present between the upper surfaces of the silicon nitride films 34 and that of the gate electrode 4. However, the silicon grown on the upper surfaces of the silicon nitride films 34 comes into contact with that grown on the upper surface of the gate electrode 4 due to silicon growth along the gate length, whereby a silicon growth layer 15 extending from the upper surfaces of the silicon nitride films 34 to that of the gate electrode 4 can be formed as a result. Further, silicon growth layers 16 are formed on the upper surface of the silicon substrate 1 in the portions formed with the impurity regions 13, while silicon growth layers 37 are formed on the side surfaces of the silicon nitride films 34. These silicon growth layers 16 and 37 are in contact with each other. Side surfaces of the silicon nitride films 34 opposite to the gate electrode 4 are covered with the silicon oxide films 35, to allow no growth of silicon. In other words, the silicon oxide films 35 have a function of preventing the silicon growth layer 15 from coming into contact with the silicon growth layers 16 and 37.

Figure 16:
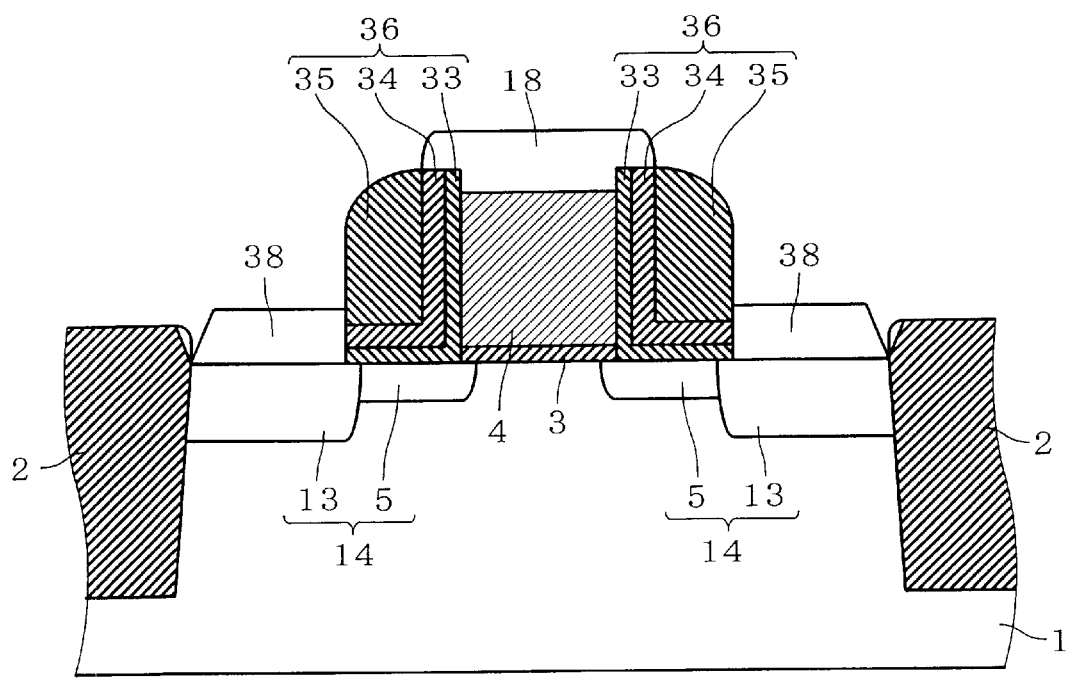

Then, a cobalt layer 17 is deposited on the overall surface by CVD, for example (FIG. 15), and thereafter heat treatment is performed in an inert gas atmosphere of nitrogen or argon. Thus, the cobalt layer 17 reacts with the silicon growth layers 15, 16 and 37, to form cobalt silicide layers 18 and 38. Thereafter unreacted parts of the cobalt layer 17 are removed from portions not in contact with the silicon growth layers 15, 16 and 37 (FIG. 16). A MOSFET having a salicide structure is formed through the aforementioned steps. Thereafter the device is completed through a process including a step of forming an interlayer insulative film, a wiring step and the like.

In the method of manufacturing a semiconductor device according to the embodiment 2, the portions exposing the side surfaces of the silicon nitride films 34 are present on the side surfaces of the side walls 36, whereby the silicon growth layers 37 are formed also on these portions by growing silicon. The portions exposing the side surfaces of the silicon nitride films 34 are formed around the upper surface of the silicon substrate 1, whereby the silicon growth layers 37 come into contact with the silicon growth layers 16 grown on the silicon substrate 1. Therefore, occurrence of the facet 20a shown in FIG. 10 can be avoided.

Embodiment 3

Figure 17:
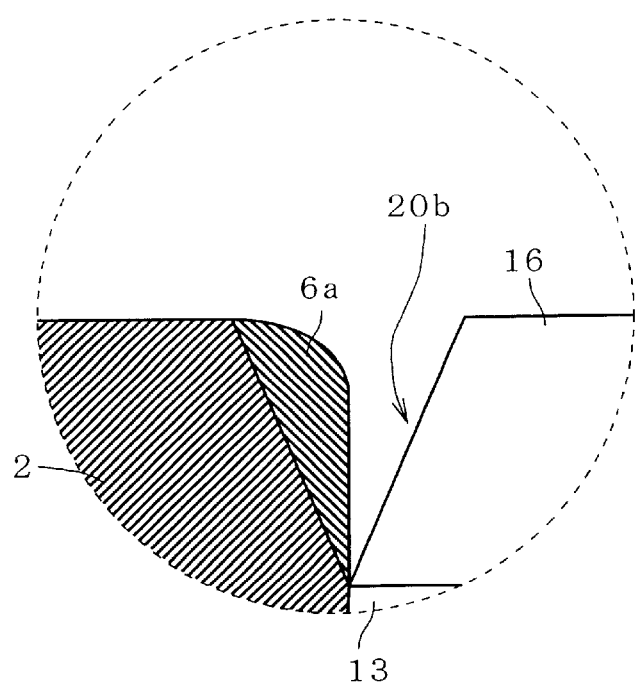
FIG. 17 is a sectional view showing a part B in FIG. 7 in an enlarged manner.

FIG. 17 is a sectional view showing a part B in FIG. 7 in an enlarged manner. A facet 20b appears on an end portion of the silicon growth layer 16 opposite to the gate E electrode 4. A silicon oxide film 6a formed on a side wall portion of the element isolation insulative film 2 is defined by the silicon oxide film 6, deposited on the element isolation insulative film 2, remaining on the side wall portion of the element isolation insulative film 2 in the anisotropic dry etching for forming the silicon oxide film 8 and the silicon nitride film 9 shown in FIG. 3. In an embodiment 3 of the present invention, a method of manufacturing a semiconductor device capable of avoiding occurrence of such a facet 20b is proposed.

Figure 18:
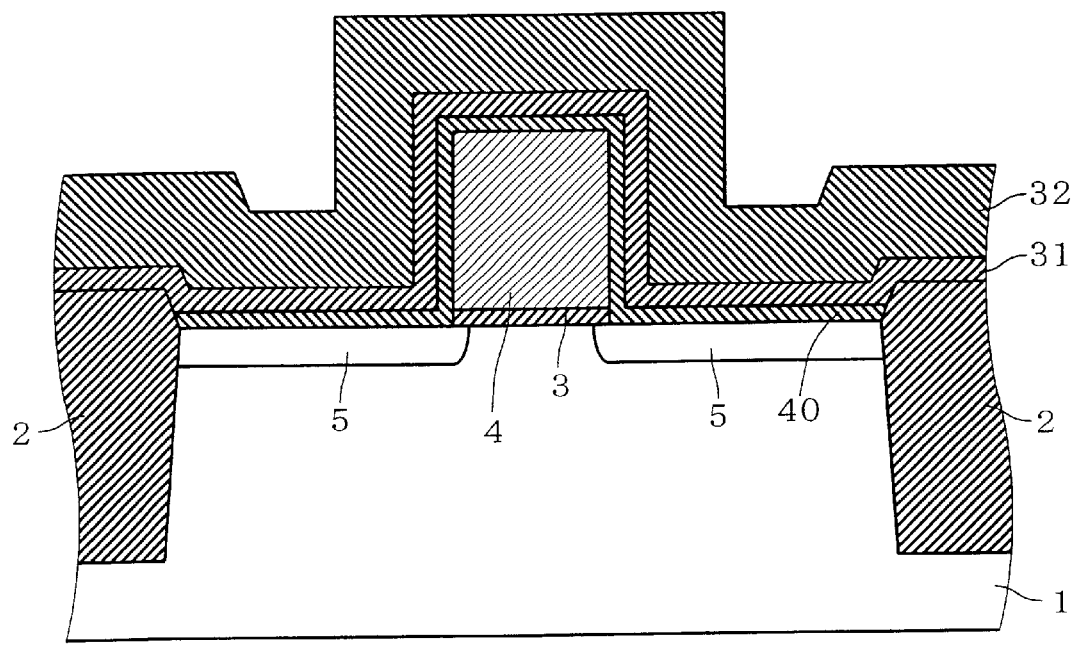
FIGS. 18 to 25 are sectional views showing a method of manufacturing a semiconductor device according to an embodiment 3 of the present invention in step order.

FIGS. 18 to 25 are sectional views showing the method of manufacturing a semiconductor device according to the embodiment 3 of the present invention in step order. The embodiment 3 is based on the method of manufacturing a semiconductor device according to the embodiment 2 of the present invention in particular, and the following description is made with reference to the difference between the embodiments 2 and 3. First, a structure similar to that shown in FIG. 1 is obtained by a method similar to that in the embodiment 1, and thereafter a thermal oxide film 40 is formed on an upper surface of a silicon substrate I and side surfaces and an upper surface of a gate electrode 4 by thermal oxidation. Thereafter a silicon nitride film 31 is deposited on the thermal oxide film 40 and a silicon oxide film 32 is further deposited on the silicon nitride film 31 by CVD, for example (FIG. 18).

Figure 19:
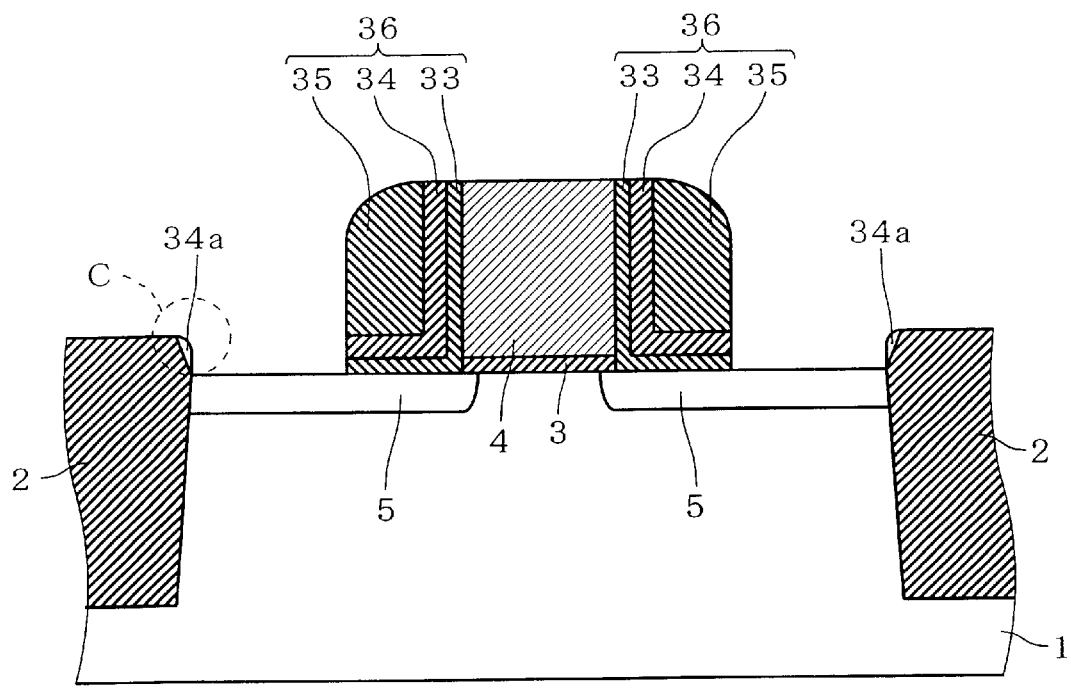
Figure 20:
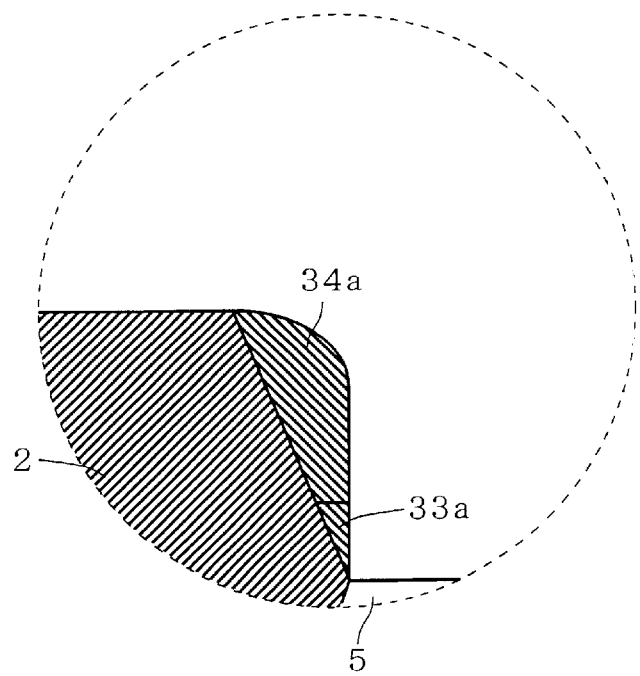

Then, the silicon oxide film 32, the silicon nitride film 31 and the thermal oxide film 40 are etched in this order by anisotropic dry etching having a high etching rate along the depth of the silicon substrate 1, to expose the upper surface of the silicon substrate 1. Thus, side walls 36 defined by silicon oxide films 33 and 35 and silicon nitride films 34 are formed on side wall portions of the gate electrode 4 (FIG. 19). FIG. is a sectional view showing a part C in FIG. 19 in an enlarged manner. A part of an element isolation insulative film 2 projects beyond the upper surface of the silicon substrate 1. On a side wall portion of the element isolation insulative film 2, therefore, a thermal oxide film 33a and a silicon nitride film 34a remaining on the side wall portion in the anisotropic dry etching for forming the silicon oxide films 33 and 35 and the silicon nitride films 34 is present.

Figure 21:
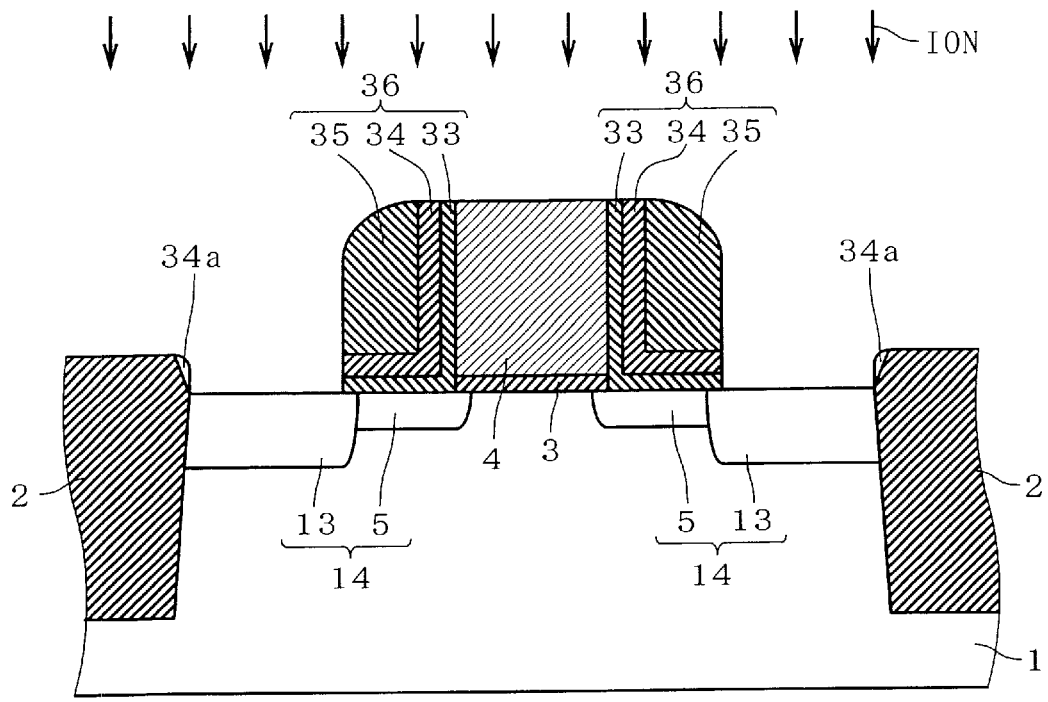

Then, ion implantation is performed through the gate electrode and the side walls 36 serving as masks, to form impurity regions 13 in the exposed upper surface of the silicon substrate 1. Consequently, source/drain regions 14 defined by extensions 5 and the impurity regions 13 are formed in the upper surface of the silicon substrate 1 (FIG. 21).

Figure 22:
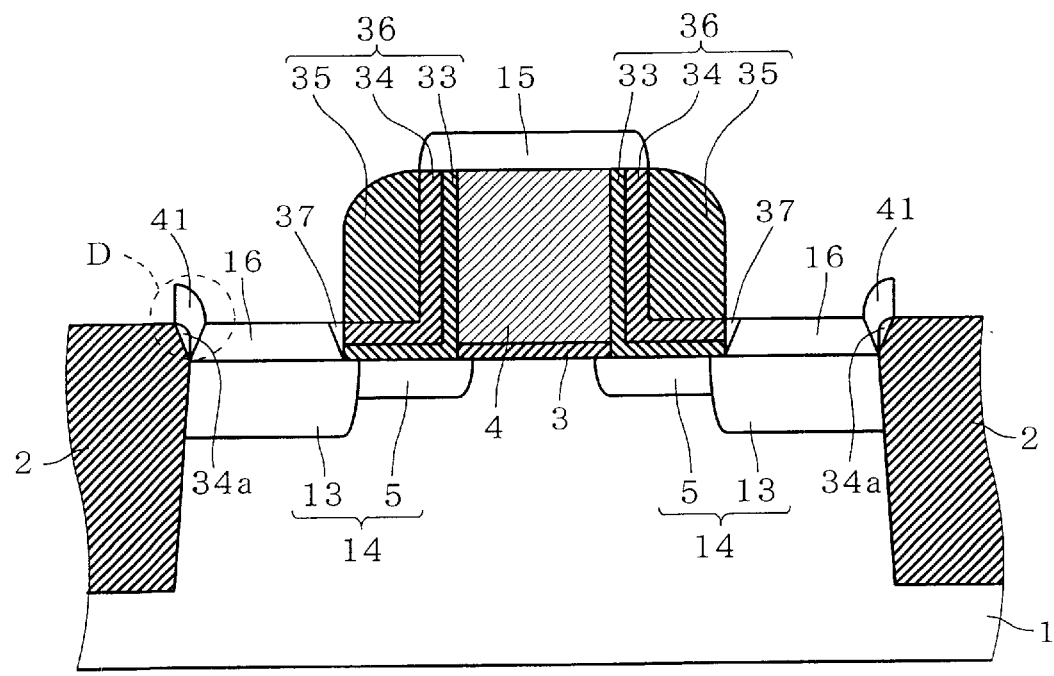
Figure 23:
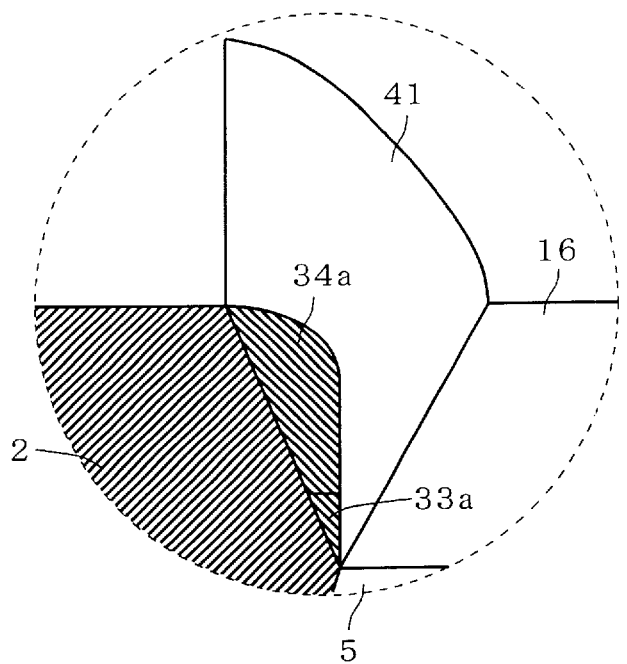

Then, silicon is grown under conditions having selectivity for a silicon oxide film similarly to the embodiment 1. Thus, silicon is grown on upper surfaces of the silicon nitride films 34, the upper surface of the gate electrode 4, the upper surface of the silicon substrate 1 in the portions formed with the impurity regions 13, side surfaces of the silicon nitride films 34 exposed on those of the side walls 36 and surfaces of the silicon nitride films 34a remaining on the element isolation insulative films 2 respectively (FIG. 22). FIG. 23 is a sectional view showing a part D in FIG. 22 in an enlarged manner. As shown in FIG. 23, a silicon growth layer 41 formed on the surface of the silicon nitride film 34a is in contact with a silicon growth layer 16 formed on the silicon substrate 1.

Figure 24:
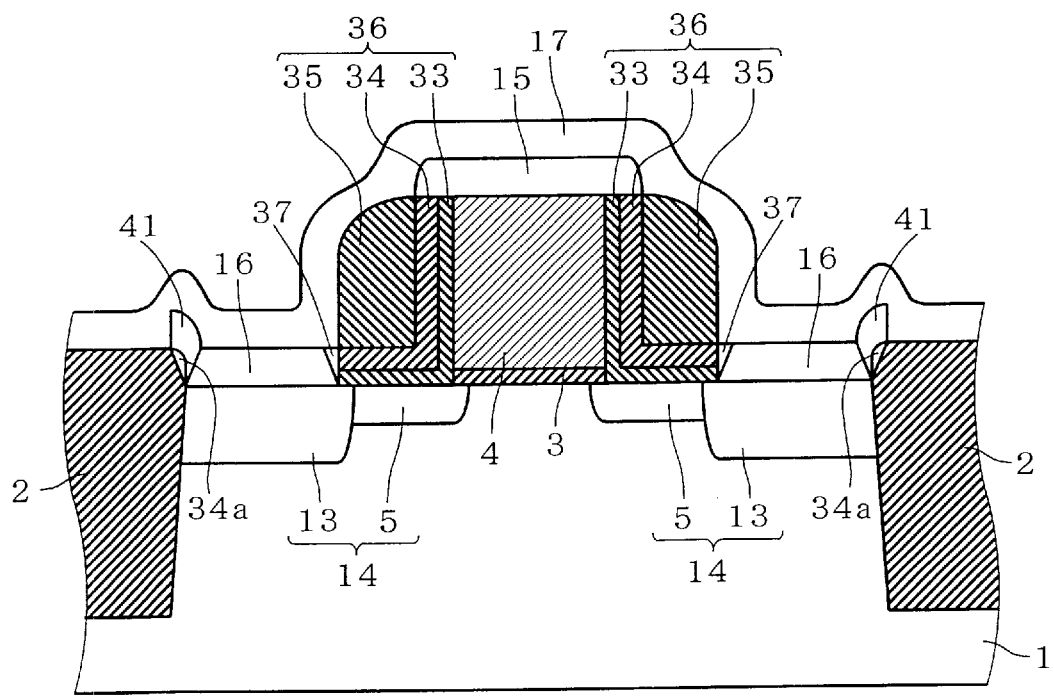
Figure 25:
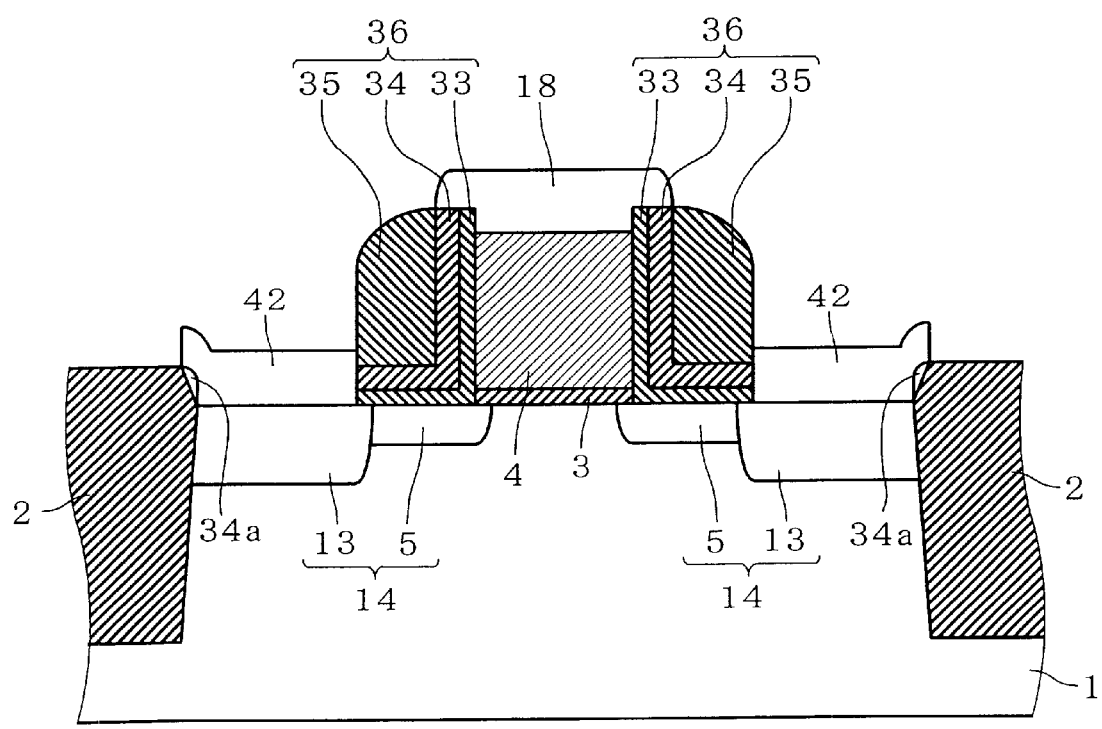

Then, a cobalt layer 17 is deposited on the overall surface by CVD, for example (FIG. 24), and thereafter heat treatment is performed in an inert gas atmosphere of nitrogen or argon. Thus, the cobalt layer 17 reacts with the silicon growth layers 15, 16, 37 and 41, to form cobalt silicide layers 18 and 42. Thereafter unreacted parts of the cobalt layer 17 are removed from portions not in contact with the silicon growth layers 15, 16, 37 and 41 (FIG. 25). A MOSFET having a salicide structure is formed through the aforementioned steps. Thereafter the device is completed through a process including a step of forming an interlayer insulative film, a wiring step and the like.

While the above description has been made on the basis of the method of manufacturing a semiconductor device according to the embodiment 2, the method of manufacturing a semiconductor device according to the embodiment 3 can alternatively be carried out on the basis of the method of manufacturing a semiconductor device according to the embodiment 1.

In the method of manufacturing a semiconductor device according to the embodiment 3 of the present invention, the silicon nitride films 34a are present on the side wall portions of the element isolation insulative films 2, whereby the silicon growth layers 41 are formed also on these portions by growing silicon. As shown in FIG. 24, the silicon growth layers 41 come into contact with the silicon growth layers 16 grown on the silicon substrate 1. Therefore, occurrence of the facet 20b shown in FIG. 17 can be avoided.

Consequently, the distances between the upper surfaces of the silicon growth layers 16, 37 and 41 and the upper surface of the silicon substrate 1 are increased so that the cobalt silicide layers 42 do not reach a deep portion in the silicon substrate 1, whereby the source/drain regions 14 can be shallowly formed for attaining refinement of the semiconductor device.

Embodiment 4

An embodiment 4 of the present invention relates to a method of manufacturing a semiconductor device having a plurality of types of semiconductor elements having different applications formed in a single wafer. The following description is made on the case of forming a DRAM-MOSFET in a DRAM part of a silicon substrate while forming a logic MOSFET in a logic part, in particular.

Figure 26:
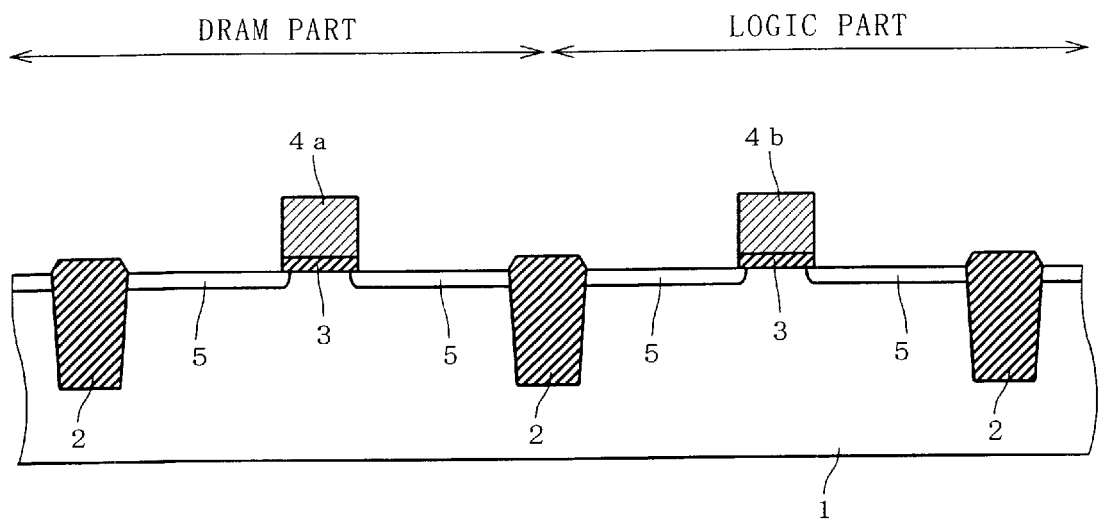
FIGS. 26 to 34 are sectional views showing a method of manufacturing a semiconductor device according to an embodiment 4 of the present invention in step order.
Figure 27:
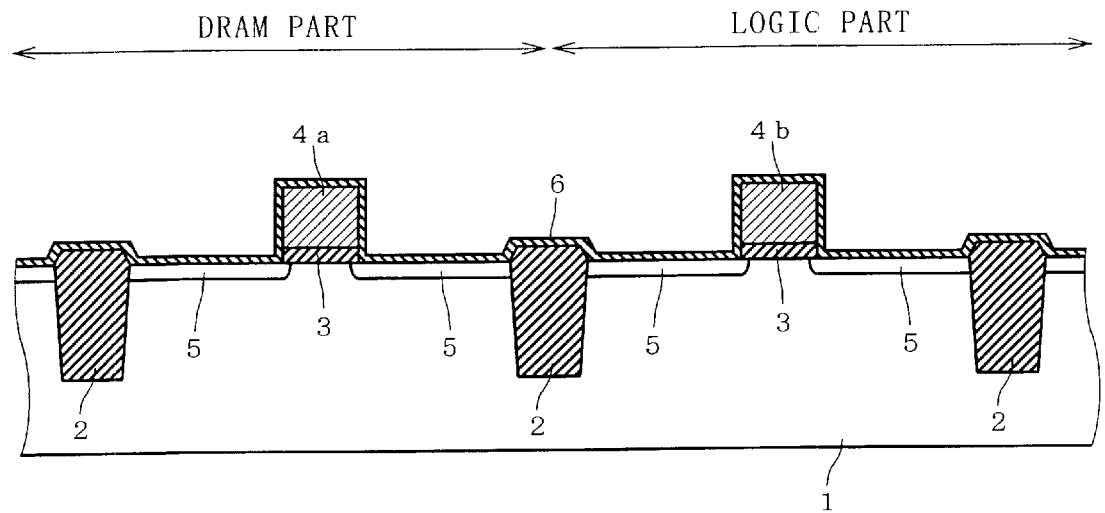

FIGS. 26 to 34 are sectional views showing the method of manufacturing a semiconductor device according to the embodiment 4 of the present invention in step order. First, element isolation insulative films 2 consisting of silicon oxide are formed on element isolation regions of a silicon substrate 1, and thereafter ion implantation for forming a well and a channel (not shown) is performed in relation to the overall surface of the silicon substrate 1. Thereafter a multilayer structure of a gate oxide film 3 and a gate electrode 4a stacked in this order is selectively formed on an upper surface of the silicon substrate 1 in a DRAM part, while a multilayer structure of a gate oxide film 3 and a gate electrode 4b stacked in this order is selectively formed on the upper surface of the silicon substrate 1 in a logic part. The gate oxide films 3 consist of silicon oxide, for example, and the gate electrodes 4a and 4b consist of polysilicon, for example. The width of the gate electrodes 4a and 4b (substantially equal to the gate length) is about 0.1$\mu$m. Thereafter ion implantation is performed in relation to the overall surface of the silicon substrate 1 through the gate electrodes 4a and 4b serving as masks, to form extensions 5 in the upper surface of the silicon substrate 1 (FIG. 26).

Figure 28:
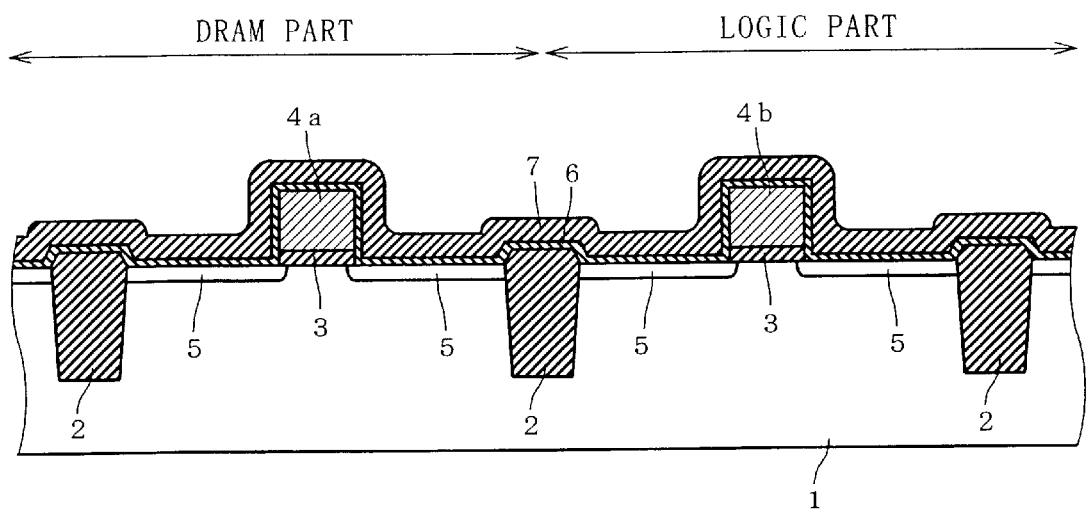

Then, a silicon oxide film 6 is deposited on the overall surface by CVD, for example (FIG. 27), and thereafter a silicon nitride film 7 is deposited on the silicon oxide film 6 (FIG. 28). The silicon oxide film 6, which is an underlayer oxide film for preventing the silicon nitride film 7 from coming into contact with the silicon substrate 1, may be about 0.01 $\mu$m in thickness. The silicon nitride film 7 may be deposited in a thickness of about 0.05 $\mu$m.

Figure 29:
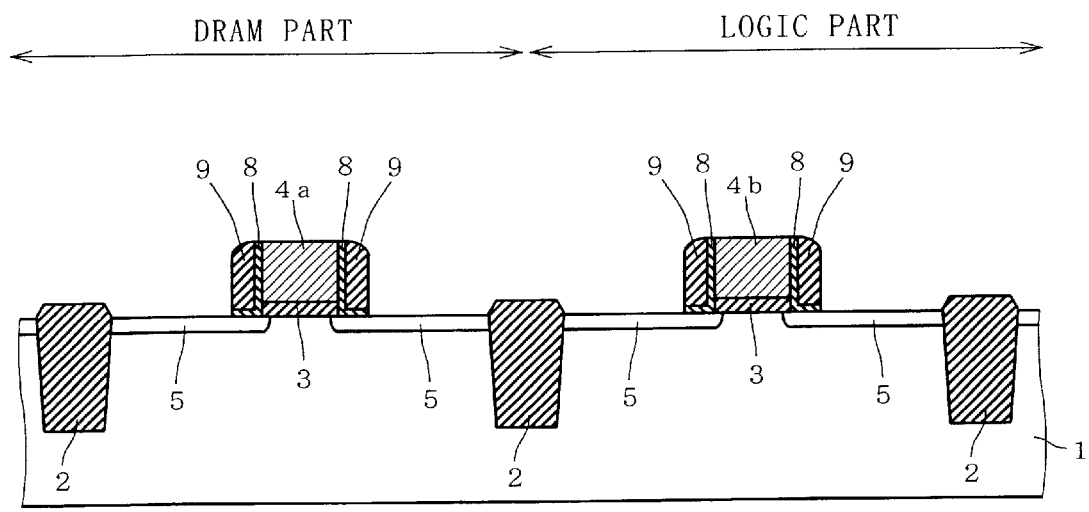

Then, the silicon nitride film 7 and the silicon oxide film 6 are etched in this order by anisotropic dry etching having a high etching rate along the depth of the silicon substrate 1, to expose the upper surface of the silicon substrate 1. At this time, silicon nitride films 9 and silicon oxide films 8 remain on respective side wall portions of the gate electrodes 4a and 4b (FIG. 29).

Figure 30:
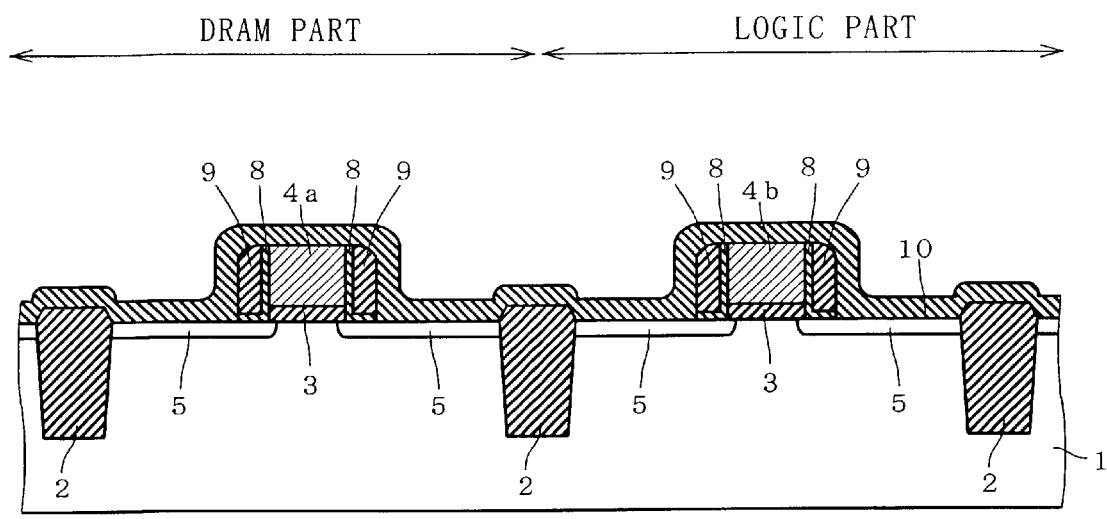
Figure 31:
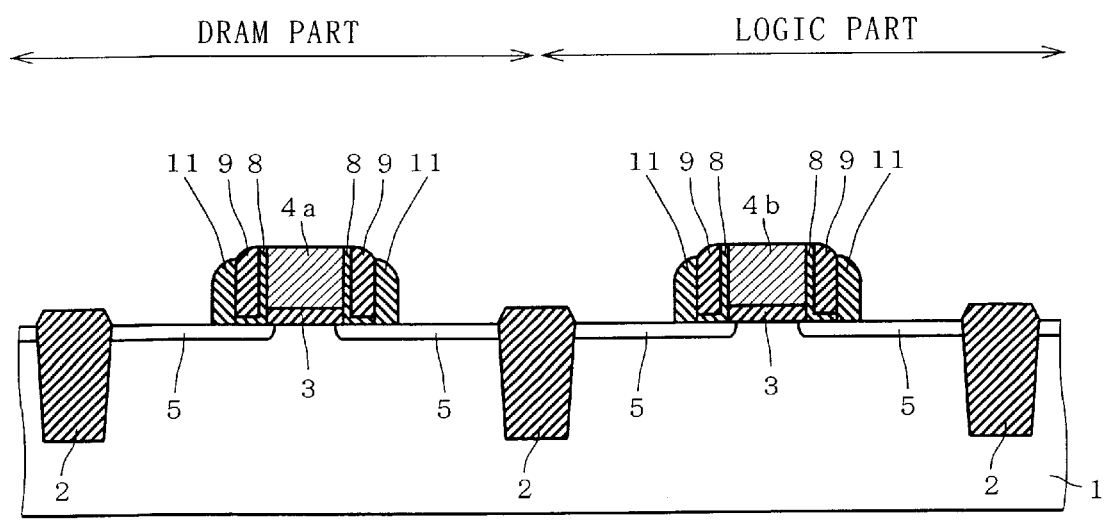

Then, a silicon oxide film 10 of about 0.05 $\mu$m in thickness is deposited on the overall surface by CVD, for example (FIG. 30). Then, the silicon nitride film 10 is etched by anisotropic dry etching having a high etching rate along the depth of the silicon substrate 1, to expose the upper surface of the silicon substrate 1 (FIG. 31). At this time, silicon oxide films 11 remain on side wall portions of the silicon nitride films 9 opposite to the gate electrodes 4a and 4b, as shown in FIG. 31.

Figure 32:
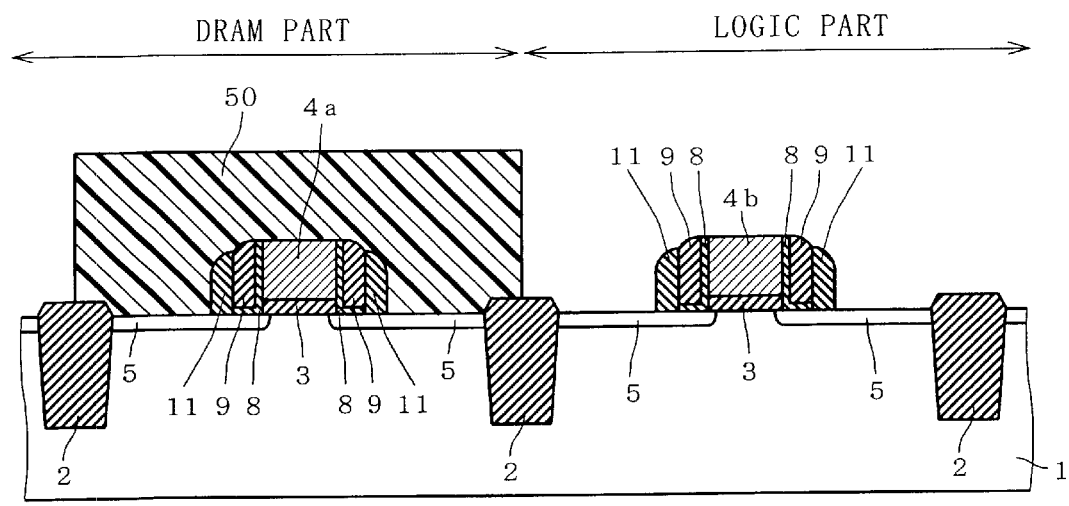
Figure 33:
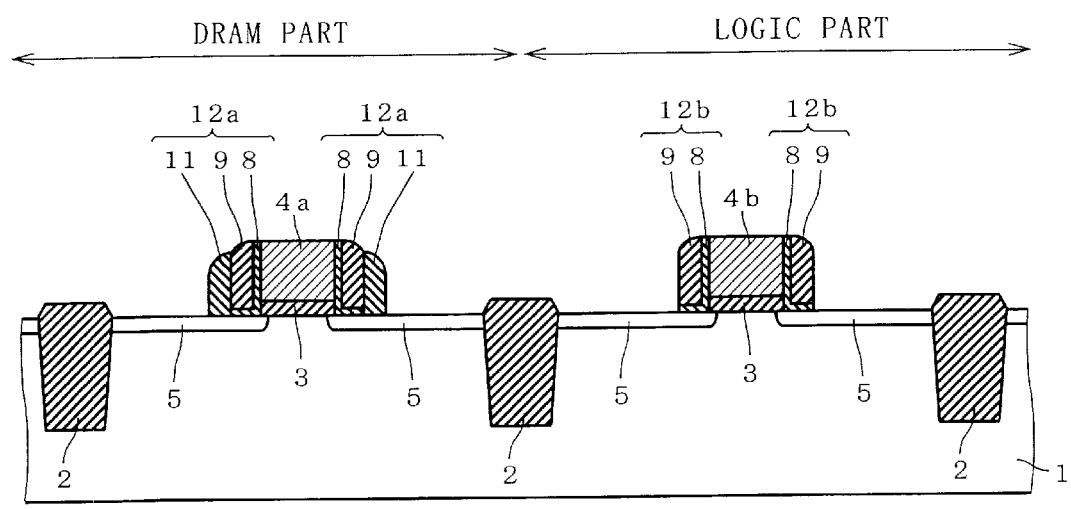

Then, a resist film 50 is formed on the DRAM part of the silicon substrate 1 by photolithography (FIG. 32). The silicon oxide films 11 of the logic part not covered with the resist film 50 are removed with hydrofluoric acid, for example. Thereafter the resist film 50 is removed (FIG. 33). As shown in FIG. 33, side walls 12a defined by the silicon oxide films 8 and 11 and the silicon nitride films 9 are formed on side wall portions of the gate electrode 4a in the DRAM part of the silicon substrate 1, while side walls 12b defined by the silicon oxide films 8 and the silicon nitride films 9 are formed on side wall portions of the gate electrode 4b in the logic part.

Figure 34:
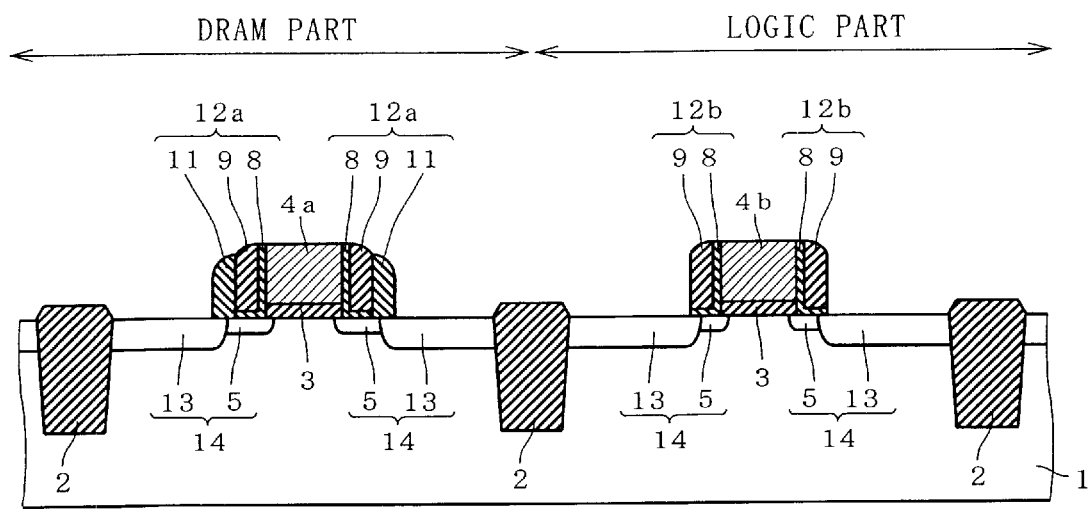

Then, ion implantation is performed through the gate electrodes 4a and 4b, the silicon oxide films 8 and 11 and the silicon nitride films 9 serving as masks, to form impurity regions 13 in the exposed upper surface of the silicon substrate 1. Consequently, source/drain regions 14 defined by extensions 5 and the impurity regions 13 are formed in the upper surface of the silicon substrate 1 in the DRAM part and the logic part respectively (FIG. 34). A DRAM-MOSFET and a logic MOSFET are formed on the DRAM part and the logic part of the silicon substrate 1 respectively through the aforementioned steps. Thereafter the device is completed through a process including a step of forming an interlayer insulative film, a wiring step and the like.

In the method of manufacturing a semiconductor device according to the embodiment 4 of the present invention, the width of each side wall 12a of the DRAM-MOSFET is equal to the total of the widths of the silicon oxide films 8 and 11 and the silicon nitride film 9, while that of each side wall 12b of the logic MOSFET is equal to the total of the widths of the silicon oxide film 8 and the silicon nitride film 9. In other words, the widths of the side walls 12a and 12b can be set at different values in the DRAM-MOSFET and the logic MOSFET. Consequently, the distances between the impurity regions 13 in source parts and the impurity regions 13 in drain parts can be made different in the DRAM-MOSFET and the logic MOSFET. Therefore, stable electric characteristics can be attained in the DRAM-MOSFET by increasing the distance, while high drivability can be attained in the logic MOSFET by reducing the distance.

Embodiment 5

An embodiment 5 of the present invention relates to a combination of the method of manufacturing a semiconductor device according to the embodiment 4 of the present invention and the method of manufacturing a semiconductor device according to he embodiment 1 of the present invention.

Figure 35:
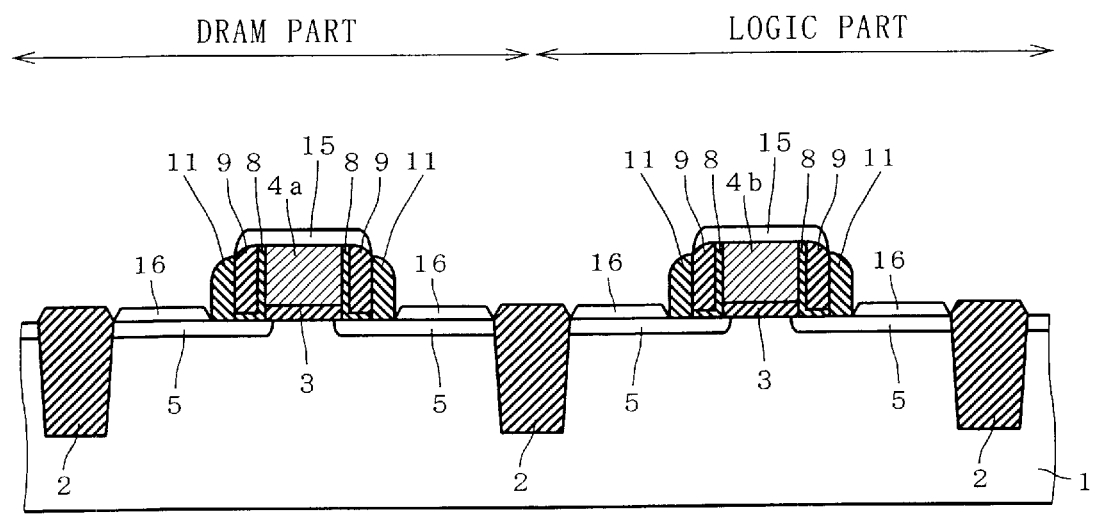
FIGS. 35 to 39 are sectional views showing a method of manufacturing a semiconductor device according to an embodiment 5 of the present invention in step order.

FIGS. 35 to 39 are sectional views showing a method of manufacturing a semiconductor device according to the embodiment 5 of the present invention in step order. First, a structure similar to that shown in FIG. 31 is obtained by a method similar to that in the embodiment 4. Thereafter silicon is grown under conditions having a selectivity for a silicon oxide film similarly to the embodiment 1, to form silicon growth layers 15 and 16 (FIG. 35).

Figure 36:
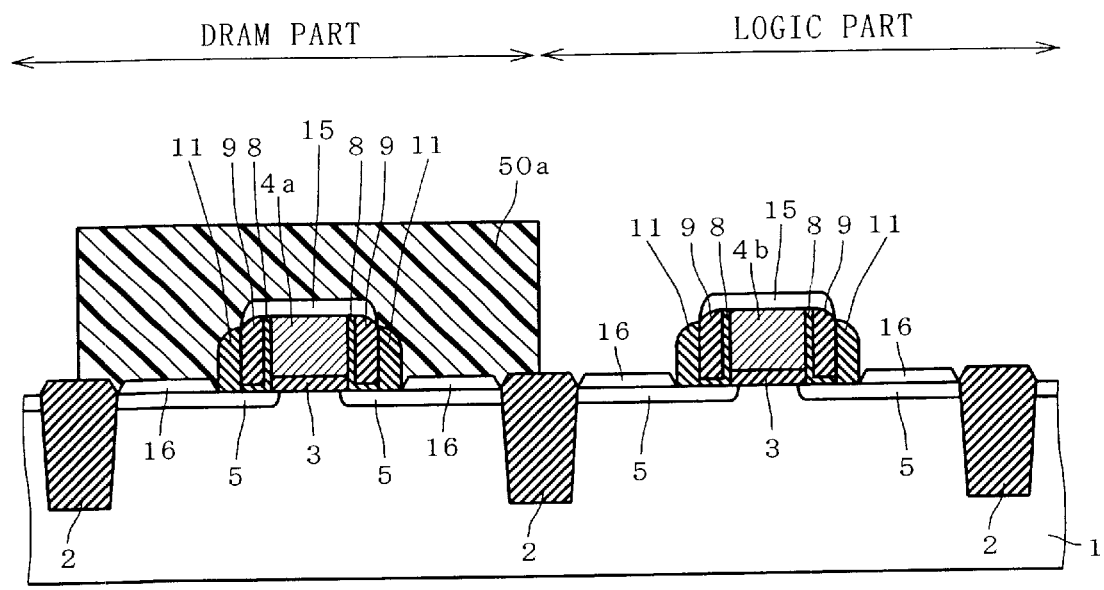
Figure 37:
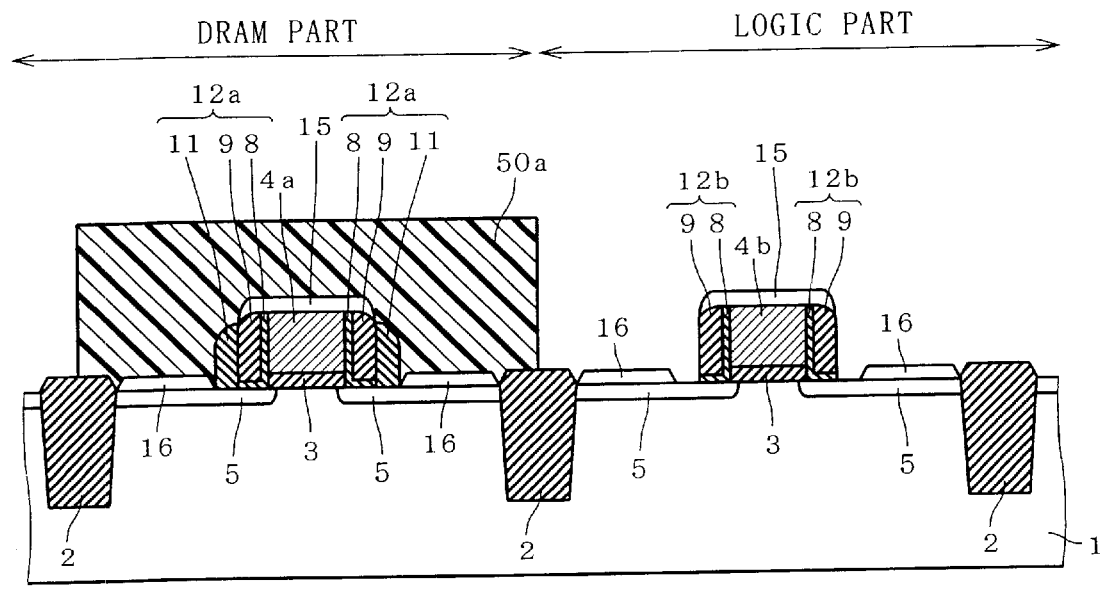

Then, a resist film 50a is formed on a DRAM part of a silicon substrate 1 by photolithography (FIG. 36). Then, silicon oxide films 11 of a logic part not covered with the resist film 50a are removed with hydrofluoric acid, for example (FIG. 37). As shown in FIG. 37, side walls 12a defined by silicon oxide films 8 and 11 and silicon nitride films 9 are formed on side wall portions of a gate electrode 4a in the DRAM part of the silicon substrate 1, while side walls 12b defined by silicon oxide films 8 and silicon nitride films 9 are formed on side wall portions of a gate electrode 4b in the logic part.

Figure 38:
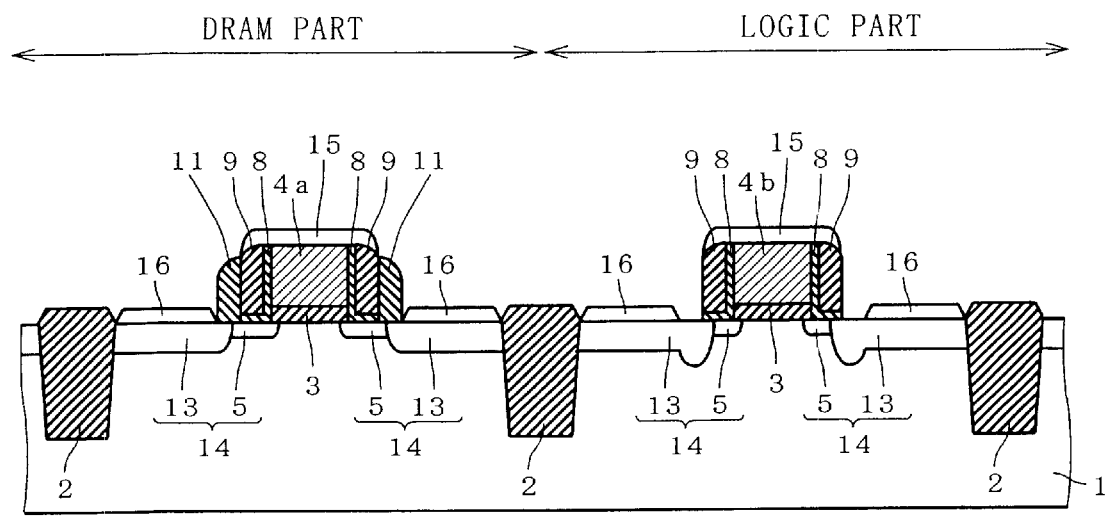

Then, the resist film 50a is removed, and thereafter ion implantation is performed to form impurity regions 13 in an upper surface of the silicon substrate 1. Consequently, source/drain regions 14 defined by extensions 5 and the impurity regions 13 are formed in the upper surface of the silicon substrate 1 in the DRAM part and the logic part respectively (FIG. 38).

Figure 39:
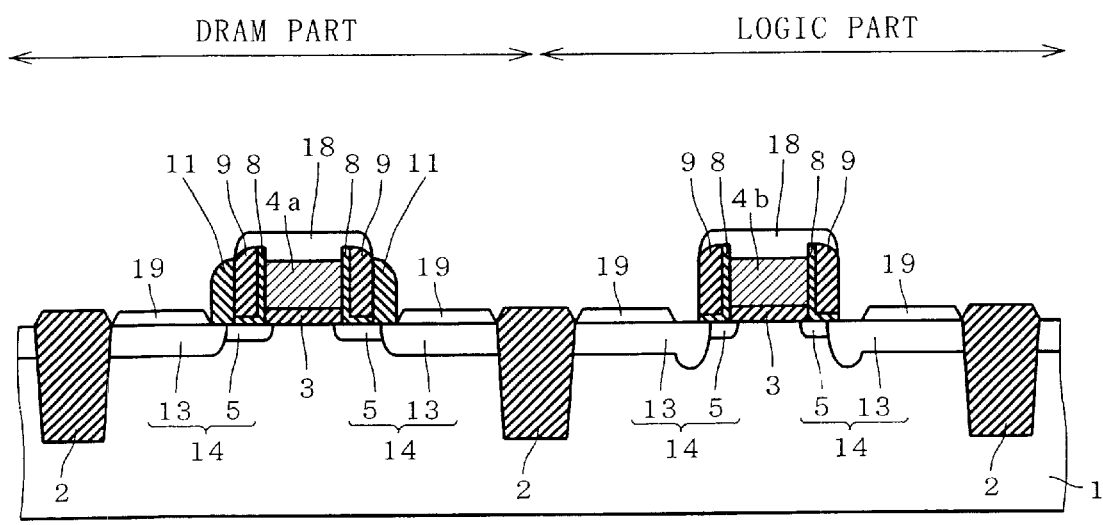

Then, a cobalt layer (not shown) is deposited on the overall surface by CVD, for example, and thereafter heat treatment is performed in an inert gas atmosphere of nitrogen or argon, to form cobalt silicide layers 18 and 19. Thereafter unreacted parts of the cobalt layer are removed (FIG. 39). A DRAM-MOSFET and a logic MOSFET having a salicide structure are formed on the DRAM part and the logic part of the silicon substrate 1 respectively through the aforementioned steps. Thereafter the device is completed through a process including a step of forming an interlayer insulative film, a wiring step and the like.

In the method of manufacturing a semiconductor device according to the embodiment 5 of the present invention, the cobalt silicide layers 18 are formed on the gate electrodes 4a and 4b respectively, whereby gate resistance of the DRAM-MOSFET and the logic MOSFET can be reduced while the widths of the side walls 12a in the DRAM-MOSFET and the side walls 12b in the logic MOSFET can be set independently of each other.

Embodiment 6

An embodiment 6 of the present invention relates to a combination of the method of manufacturing a semiconductor device according to the embodiment 4 of the present invention and the method of manufacturing a semiconductor device according to the embodiment 1 of the present invention, and in particular, the method of manufacturing a semiconductor device according to the embodiment 1 is applied to only a DRAM-MOSFET formed on a single silicon substrate 1 along with a logic MOSFET.

Figure 40:
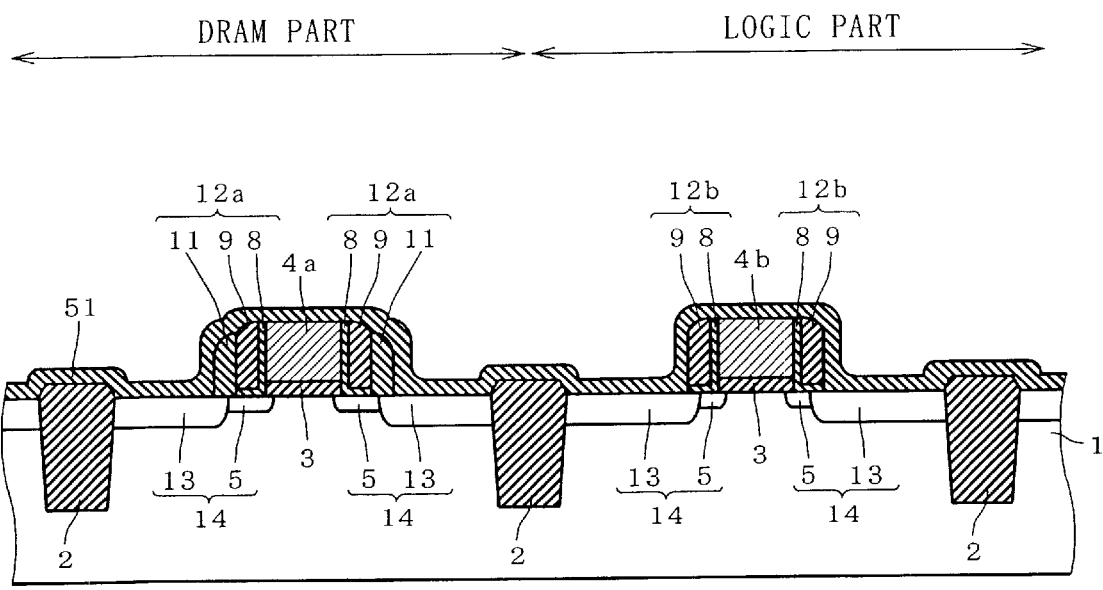
FIGS. 40 to 45 are sectional views showing a method of manufacturing a semiconductor device according to an embodiment 6 of the present invention in step order.

FIGS. 40 to 45 are sectional views showing a method of manufacturing a semiconductor device according to the embodiment 6 of the present invention in step order. First, a structure similar to that shown in FIG. 34 is obtained by a method similar to that in the embodiment 4, and thereafter a silicon oxide film 51 is deposited on the overall surface by CVD, for example (FIG. 40).

Figure 41:
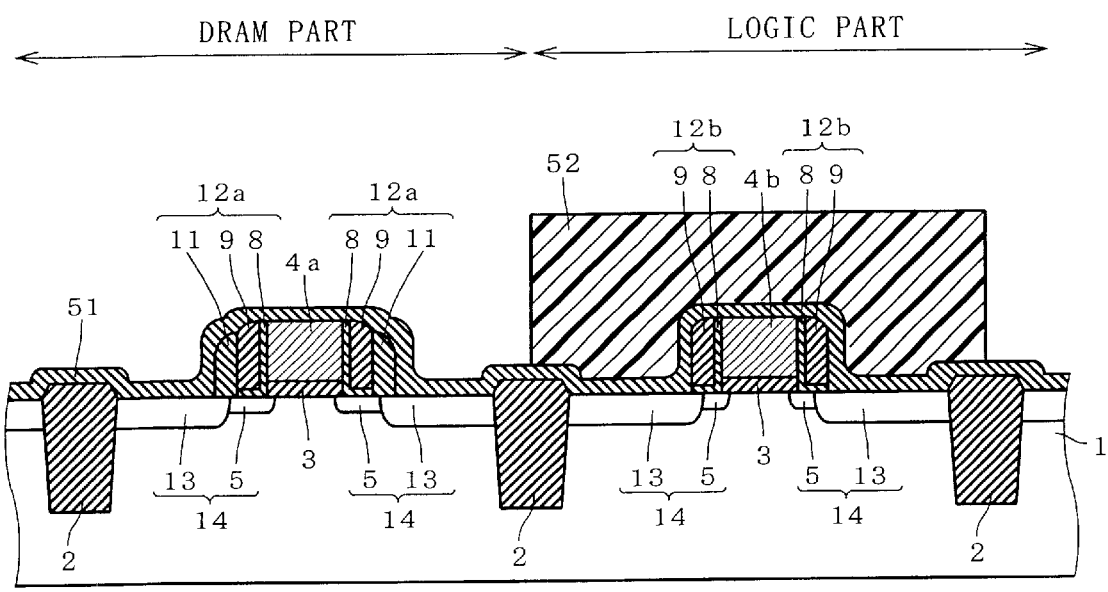
Figure 42:
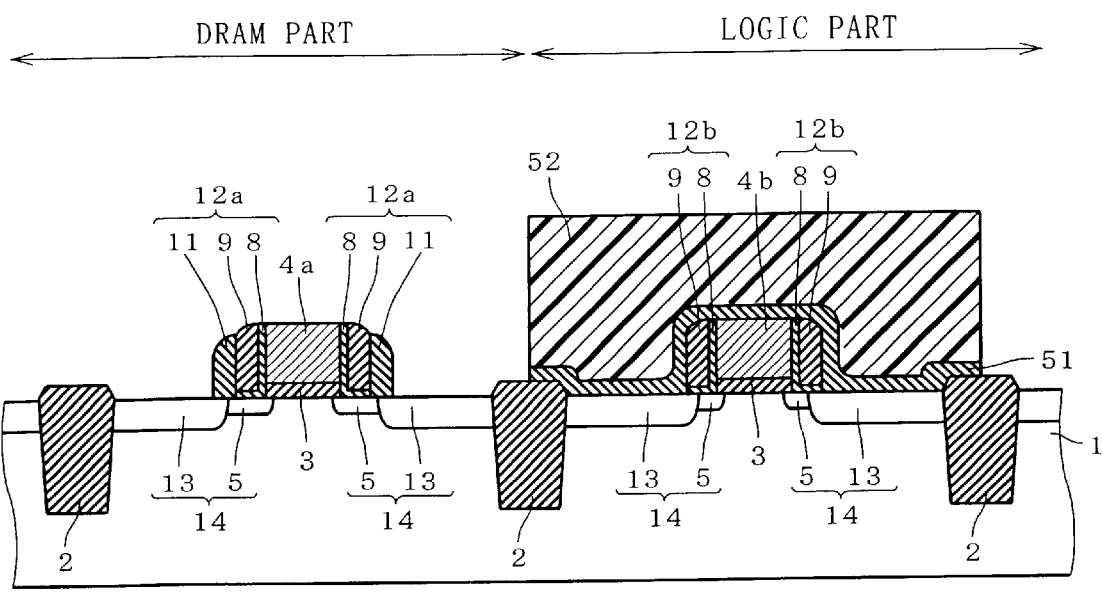
Figure 43:
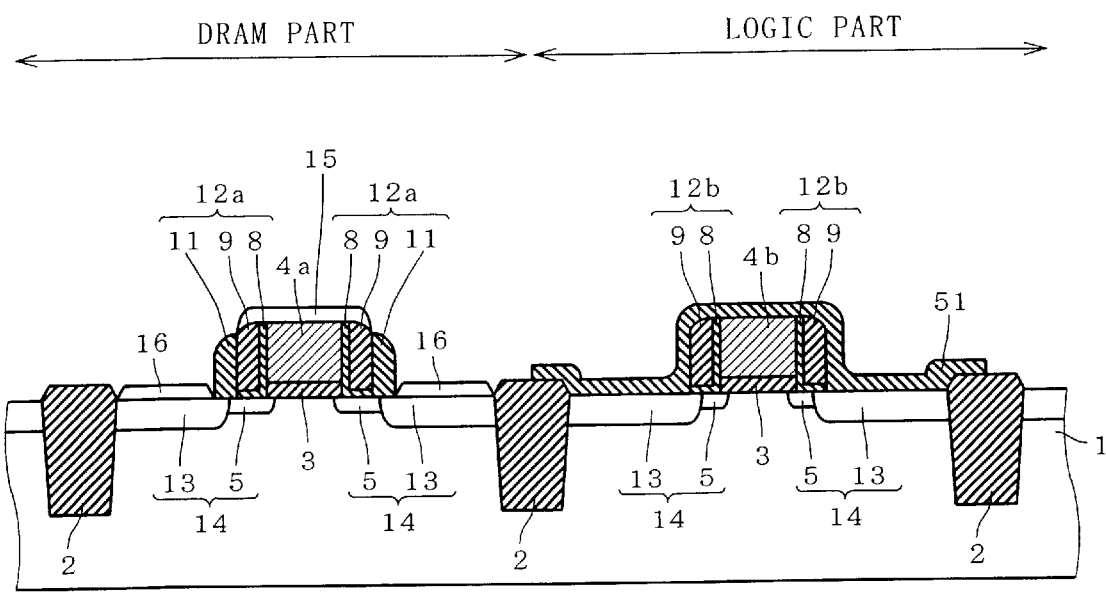

Then, a resist film 52 is formed on a logic part of the silicon substrate 1 by photolithography (FIG. 41). Then, the silicon oxide film 51 is removed from a DRAM part not covered with the resist film 52 with hydrofluoric acid, for example (FIG. 42). Then, the resist film 52 is removed, and thereafter silicon is grown under conditions having selectivity for a silicon oxide film similarly to the embodiment 1, to form silicon growth layers 15 and 16 in the DRAM part of the silicon substrate 1 (FIG. 43).

Figure 44:
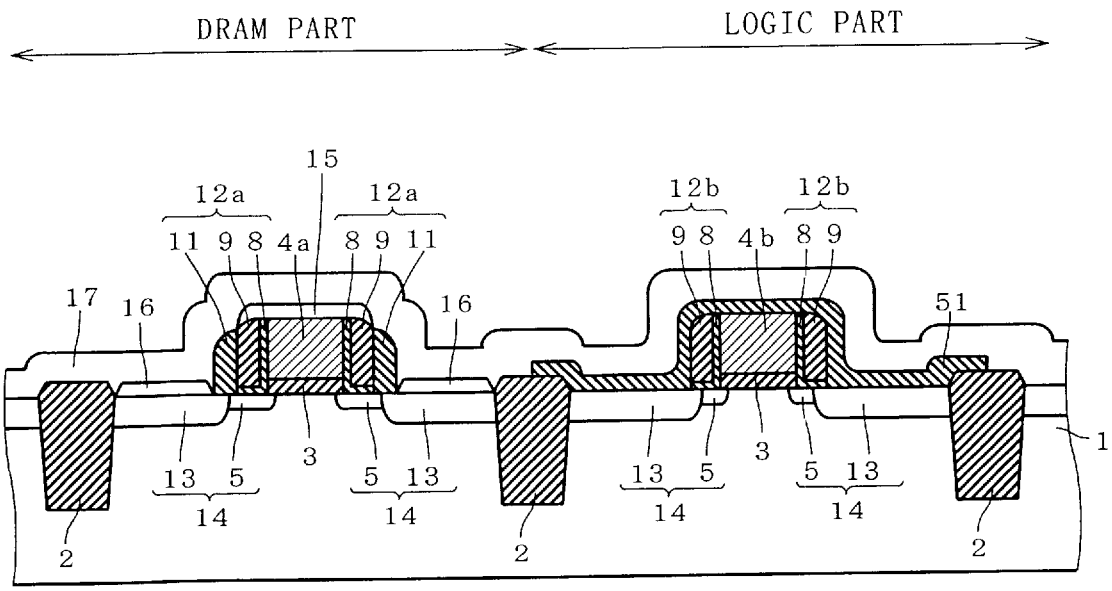
Figure 45:
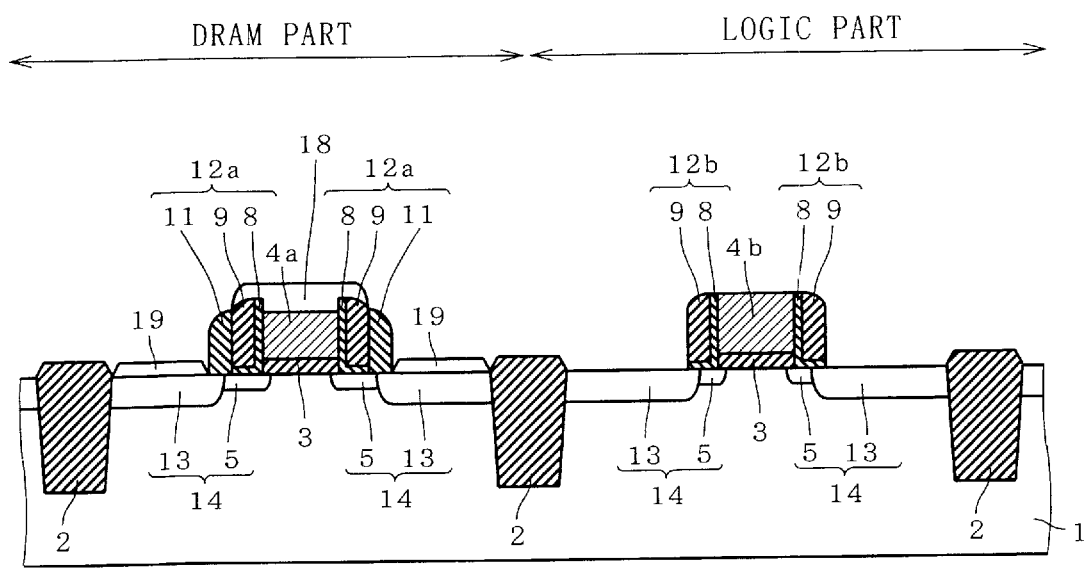

Then, a cobalt layer 17 is deposited on the overall surface by CVD, for example FIG. 44). Then, heat treatment is performed in an inert gas atmosphere of nitrogen or argon, to form cobalt silicide layers 18 and 19. Thereafter unreacted parts of the cobalt layer 17 are removed. Further, the silicon oxide film 51 is removed with hydrofluoric acid, for example (FIG. 45). The DRAM-MOSFET and the logic MOSFET having a salicide structure are formed on the DRAM part and the logic part of the silicon substrate 1 respectively through the aforementioned steps. Thereafter the device is completed through a process including a step of forming an interlayer insulative film, a wiring step and the like.

In the method of manufacturing a semiconductor device according to the embodiment 6 of the present invention, gate resistance of the DRAM-MOSFET can be reduced by forming the cobalt silicide layer 18 on a gate electrode 4a while the widths of side walls 12a in the DRAM-MOSFET and side walls 12b in the logic MOSFET can be set independently of each other.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising the steps of:
    (a) selectively forming a multilayer structure of a gate insulator film and a gate electrode stacked in this order on a main surface of a substrate;
    (b) forming a side wall consisting of at least first and second materials and having an exposure region exposing said second material between a portion of an upper surface of said side wall exposing said first material and an upper surface of said multilayer structure on a side wall portion of said multilayer structure;
    (c) forming a semiconductor layer extending over said exposure region and said upper surface of said multilayer structure; and
    (d) forming a conductive layer from said semiconductor layer.

2. The method of manufacturing a semiconductor device according to claim 1, wherein said side wall consists of said first and second materials and a third material,
    said upper surface of said side wall has a portion exposing said third material between said exposure region and said upper surface of said multilayer structure,
    said step (c) is carried out through the step of:
        growing a semiconductor from each of said exposure region and said upper surface of said multilayer structure thereby forming a semiconductor growth layer extending over said exposure region and said upper surface of said multilayer structure through growth to the direction of the gate length, and
    said step (d) is carried out through the step of:
        forming a semiconductor-metal compound by reaction of said semiconductor growth layer with metal, thereby forming said conductive layer.

3. The method of manufacturing a semiconductor device according to claim 2, wherein said step (b) is carried out through the steps of:
    (b-1) forming a first film consisting of said third material on a structure obtained through said step (a),
    (b-2) forming a second film consisting of said second material on said first film,
    (b-3) etching said second and first films in this order by anisotropic etching having a high etching rate along the depth of said substrate for exposing said main surface of said substrate,
    (b-4) forming a third film consisting of said first material on a structure obtained through said step (b-3), and
    (b-5) etching said third film by anisotropic etching having a high etching rate along the depth of said substrate for exposing said main surface of said substrate.

4. The method of manufacturing a semiconductor device according to claim 3, wherein said first and third films are silicon oxide films, and said second film is a silicon nitride film.

5. A method of manufacturing a semiconductor device comprising the steps of:
    (a) selectively forming a multilayer structure of a gate insulator film and a gate electrode stacked in this order on a main surface of a substrate;
    (b) forming a side wall consisting of at least first and second materials and having a first region exposing said second material in a side surface of said side wall in the vicinity of said main surface of said substrate on a side wall portion of said multilayer structure;
    (c) growing a semiconductor from each of said first region and exposed said main surface of said substrate thereby forming a semiconductor growth layer; and
    (d) forming a semiconductor-metal compound by reaction of said semiconductor growth layer with metal.

6. The method of manufacturing a semiconductor device according to claim 5, further comprising the steps of:
    (e) forming an element isolation structure having a projecting part at least partially projecting on said main surface of said substrate on an element isolation region of said substrate, and
    (f) forming a second region consisting of a third material on a side wall portion of said projecting part, both of said steps being carried out in advance of said step (c), wherein
        in said step (c), said semiconductor growth layer is formed by growing said semiconductor from each of said first region, exposed said main surface of said substrate and said second region.

7. The method of manufacturing a semiconductor device according to claim 5, wherein said side wall consists of said first and second materials and a third material, and said step (b) is carried out through the steps of:
    (b-1) forming a first film consisting of said third material on a structure obtained through said step (a),
    (b-2) forming a second film consisting of said second material on said first film,
    (b-3) forming a third film consisting of said first material on said second film, and
    (b-4) etching said third, second and first films in this order by anisotropic etching having a high etching rate along the depth of said substrate for exposing said main surface of said substrate.

8. The method of manufacturing a semiconductor device according to claim 7, wherein said first and third films are silicon oxide films and said second film is a silicon nitride film.

9. A method of manufacturing a semiconductor device comprising the steps of:
    (a) employing a substrate having a first element forming region for forming a first semiconductor element and a second element forming region for forming a second semiconductor element, to form a first multilayer structure of a gate insulator film and a gate electrode stacked in this order on a main surface of said substrate in said first element forming region and to form a second multilayer structure of a gate insulator film and a gate electrode stacked in this order on a main surface of said substrate in said second element forming region;
    (b) forming a first side wall having a first width on a side wall portion of said first multilayer structure;
    (c) forming a second side wall having a second width different from said first width on a side wall portion of said second multilayer structure; and
    after performing steps (a), (b) and (c), performing the step of:
        (d) implanting an impurity into said main surface of said substrate in one step through said first and second multilayer structures and said first and second side walls serving as masks thereby forming paired first impurity implantation regions in said main surface of said substrate in said first element forming region and paired second impurity implantation regions in said main surface of said substrate in said second element forming region.

10. The method of manufacturing a semiconductor device according to claim 9, wherein in said step (b), said first side wall consisting of at least first and second materials and having an exposure region exposing said second material between a portion of an upper surface of said side wall exposing said first material and an upper surface of said first multilayer structure is formed, said method of manufacturing a semiconductor device further comprising the step of:
(e) forming a conductive layer extending over said exposure region and said upper surface of said first multilayer structure.

11. The method of manufacturing a semiconductor device according to claim 10, wherein said first side wall consists of said first and second materials and a third material, said upper surface of said first side wall has a portion exposing said third material between said exposure region and said upper surface of said first multilayer structure, and said step (b) is carried out through the steps of:
(b-1) forming a first film consisting of said third material on a structure obtained through said step (a),
(b-2) forming a second film consisting of said second material on said first film,
(b-3) etching said second and first films in this order by anisotropic etching having a high etching rate along the depth of said substrate for exposing said main surface of said substrate,
(b-4) forming a third film consisting of said first material on a structure obtained through said step (b-3), and
(b-5) etching said third film by anisotropic etching having a high etching rate along the depth of said substrate for exposing said main surface of said substrate.

12. The method of manufacturing a semiconductor device according to claim 11, wherein said first and third films are silicon oxide films and said second film is a silicon nitride film.

13. The method of manufacturing a semiconductor device according to claim 10, wherein in said step (c), said second side wall is formed through the steps of:

(c-1) forming said first side wall on a side wall portion of said second multilayer structure, and
(c-2) removing said first material from said first side wall.

14. The method of manufacturing a semiconductor device according to claim 1, wherein said step (d) comprises:

forming aid conductive layer to substantially cover said exposure region and said upper surface of said multilayer structure.

15. The method of manufacturing a semiconductor device according to claim 10, wherein said step (e) comprises:

forming said conductive layer to substantially cover said exposure region and said upper surface of said multilayer structure.

16. A method of manufacturing a semiconductor device comprising the steps of:

(a) selectively forming a multilayer structure of a gate insulator film and a gate electrode stacked in this order on a main surface of a substrate;
(b) forming a side wall consisting of at least first and second materials and having an exposure region exposing said second material between a portion of an upper surface of said side wall exposing said first material and an upper surface of said multilayer structure on a side wall portion of said multilayer structure; and
(c) forming a conductive layer extending from said exposure region to said upper surface of said multilayer structure;

wherein said side wall consists of said first and second materials and a third material, said upper surface of said side wall has a portion exposing said third material between said exposure region and said upper surface of said multilayer structure, and said step (c) is carried out through the steps of:
(c-1) growing a semiconductor from each of said exposure region and said upper surface of said multilayer structure thereby forming a semiconductor growth layer extending from said exposure region to said upper surface of said multilayer structure through growth to the direction of the gate length, and
(c-2) forming a semiconductor-metal compound by reaction of said semiconductor growth layer wit metal, thereby forming said conductive layer.

* * * * *